(12) United States Patent
Yoon et al.

(10) Patent No.: US 9,647,056 B2
(45) Date of Patent: May 9, 2017

(54) SEMICONDUCTOR DEVICES INCLUDING A SUPPORT FOR AN ELECTRODE AND METHODS OF FORMING SEMICONDUCTOR DEVICES INCLUDING A SUPPORT FOR AN ELECTRODE

(71) Applicant: Samsung Electronics Co., Ltd., Suwon-si, Gyeonggi-do (KR)

(72) Inventors: Junho Yoon, Suwon-si (KR); Gyungjin Min, Seongnam-si (KR); Jaehong Park, Seongnam-si (KR); Yongmoon Jang, Incheon (KR); Je-Woo Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/961,994

(22) Filed: Dec. 8, 2015

(65) Prior Publication Data
US 2016/0093686 A1 Mar. 31, 2016

Related U.S. Application Data

(63) Continuation of application No. 13/966,328, filed on Aug. 14, 2013, now Pat. No. 9,240,441.

(30) Foreign Application Priority Data

Aug. 29, 2012 (KR) ........................ 10-2012-0095090

(51) Int. Cl.
*H01L 29/92* (2006.01)
*H01L 49/02* (2006.01)

(52) U.S. Cl.
CPC .............. *H01L 28/60* (2013.01); *H01L 28/40* (2013.01); *H01L 28/56* (2013.01); *H01L 28/91* (2013.01); *H01L 28/92* (2013.01)

(58) Field of Classification Search
CPC ......... H01L 28/40; H01L 28/56; H01L 28/60; H01L 28/90; H01L 28/91; H01L 28/92
See application file for complete search history.

(56) References Cited

U.S. PATENT DOCUMENTS

| | | |
|---|---|---|
| 5,994,762 A | 11/1999 | Suwanai et al. |
| 6,242,339 B1 | 6/2001 | Aoi |
| 6,410,457 B1 | 6/2002 | M'Saad et al. |
| 6,452,274 B1 | 9/2002 | Hasegawa et al. |
| 7,094,660 B2 | 8/2006 | Park |
| 7,268,034 B2 | 9/2007 | Basceri et al. |
| 7,459,745 B2 | 12/2008 | Lee et al. |

(Continued)

FOREIGN PATENT DOCUMENTS

| | | |
|---|---|---|
| JP | 2011-061067 | 3/2011 |
| JP | 2011-166071 | 8/2011 |

(Continued)

*Primary Examiner* — Mary Wilczewski
(74) *Attorney, Agent, or Firm* — Myers Bigel, P.A.

(57) ABSTRACT

Semiconductor devices are provided. Each of the semiconductor devices may include a plurality of electrodes. Moreover, each of the semiconductor devices may include a supporting pattern connected to sidewalls of the plurality of electrodes. Related methods of forming semiconductor devices are also provided. For example, the methods may include forming the supporting pattern before forming the plurality of electrodes.

10 Claims, 38 Drawing Sheets

(56) References Cited

U.S. PATENT DOCUMENTS

| | | | |
|---|---|---|---|
| 7,572,711 B2* | 8/2009 | Park | H01L 28/91 |
| | | | 257/E21.536 |
| 7,575,971 B2 | 8/2009 | Park et al. | |
| 7,709,342 B2 | 5/2010 | Kim et al. | |
| 7,727,837 B2 | 6/2010 | Gruening-von Schwerin et al. | |
| 7,799,653 B2 | 9/2010 | Lee et al. | |
| 7,919,863 B2 | 4/2011 | Benson | |
| 8,119,476 B2* | 2/2012 | Kang | H01L 27/10817 |
| | | | 257/296 |
| 8,395,235 B2* | 3/2013 | Tsuchiya | H01L 27/10814 |
| | | | 257/306 |
| 8,927,384 B2 | 1/2015 | Kim et al. | |
| 9,209,194 B1* | 12/2015 | Ikeda | H01L 27/10897 |
| 9,240,441 B2* | 1/2016 | Yoon | H01L 28/40 |
| 9,263,536 B2* | 2/2016 | Kim | H01L 29/4236 |
| 2006/0063324 A1* | 3/2006 | Park | H01L 28/91 |
| | | | 438/239 |
| 2011/0062552 A1 | 3/2011 | Tsuchiya | |
| 2011/0065251 A1 | 3/2011 | Eun | |
| 2011/0159660 A1* | 6/2011 | Kang | H01L 27/10817 |
| | | | 438/381 |
| 2011/0306197 A1 | 12/2011 | Kim et al. | |
| 2012/0049380 A1 | 3/2012 | Kim et al. | |
| 2012/0052648 A1* | 3/2012 | Kwon | H01L 27/10894 |
| | | | 438/381 |
| 2012/0064680 A1 | 3/2012 | Oh et al. | |
| 2012/0104559 A1 | 5/2012 | Kim | |
| 2012/0193761 A1* | 8/2012 | Park | H01L 28/91 |
| | | | 257/532 |
| 2012/0225554 A1 | 9/2012 | Yoon et al. | |
| 2012/0273922 A1* | 11/2012 | Ueda | H01L 27/10817 |
| | | | 257/532 |
| 2013/0015559 A1* | 1/2013 | Lee | H01L 28/60 |
| | | | 257/532 |
| 2013/0105873 A1* | 5/2013 | Kim | H01L 27/10852 |
| | | | 257/296 |
| 2013/0147048 A1* | 6/2013 | Kuh | H01L 23/49827 |
| | | | 257/768 |
| 2013/0249053 A1* | 9/2013 | Lee | H01L 28/40 |
| | | | 257/532 |
| 2014/0065785 A1* | 3/2014 | Yoon | H01L 28/40 |
| | | | 438/381 |
| 2014/0134839 A1* | 5/2014 | Kim | H01L 29/4236 |
| | | | 438/652 |
| 2014/0138794 A1* | 5/2014 | Yang | H01L 27/10852 |
| | | | 257/532 |
| 2015/0333117 A1* | 11/2015 | Sako | H01L 27/10852 |
| | | | 257/309 |
| 2015/0364366 A1* | 12/2015 | Kim | H01L 21/76877 |
| | | | 438/396 |
| 2016/0035730 A1* | 2/2016 | Sukekawa | H01L 27/0629 |
| | | | 257/532 |
| 2016/0093686 A1* | 3/2016 | Yoon | H01L 28/40 |
| | | | 257/532 |

FOREIGN PATENT DOCUMENTS

| | | |
|---|---|---|
| KR | 1020090110692 | 10/2009 |
| KR | 1020100078971 | 7/2010 |
| KR | 1020100079828 | 7/2010 |
| KR | 1020100093925 | 8/2010 |
| KR | 1020120004212 | 1/2012 |

* cited by examiner

SEMICONDUCTOR DEVICES INCLUDING A SUPPORT FOR AN ELECTRODE AND METHODS OF FORMING SEMICONDUCTOR DEVICES INCLUDING A SUPPORT FOR AN ELECTRODE

CROSS-REFERENCE TO RELATED APPLICATION

The present application is a continuation application of and claims priority from U.S. patent application Ser. No. 13/966,328, filed on Aug. 14, 2013, which claims priority under 35 U.S.C. §119 to Korean Patent Application No. 10-2012-0095090, filed on Aug. 29, 2012, in the Korean Intellectual Property Office, and the entire content of each of the above applications is incorporated by reference herein.

BACKGROUND

The present disclosure relates to semiconductor devices and methods of forming semiconductor devices. As semiconductor devices become more highly integrated, a capacitor having a sufficient capacitance in a limited area may be required. The capacitance of a capacitor is proportional to a surface area of an electrode and a dielectric constant of a dielectric film, and is inversely proportional to an equivalent oxide thickness of the dielectric film. Attempts to increase the capacitance of a capacitor in a limited area may include increasing a surface area of an electrode by forming a capacitor of a three dimensional structure, reducing an equivalent oxide thickness of a dielectric film, and using a dielectric film having a high dielectric constant.

Increasing a surface area of an electrode may increase a height of a lower electrode (or a storage electrode). Moreover, an effective surface area of a lower electrode using a hemi-spherical grain (HSG) may be enlarged, and an inside area and an outside area of a cylinder using a one cylinder storage (OCS) electrode may be used. A dielectric film having a high dielectric constant may be a metal oxide film such as titanium dioxide ($TiO_2$) and tantalum pentoxide ($Ta_2O_5$) or a ferroelectric film of perovskite structure (e.g., lead zirconate titanate (PZT) ($PbZrTiO_3$) or barium strontium titanate (BST) ($BaSrTiO_3$)).

SUMMARY

Various embodiments of the present inventive concepts provide a semiconductor device. The semiconductor device may include a substrate. Moreover, the semiconductor device may include a plurality of capacitors. The plurality of capacitors may include a plurality of respective lower electrodes on the substrate, a dielectric film on surfaces of the plurality of lower electrodes, and an upper electrode on the dielectric film. The semiconductor device may include a first supporting pattern connected to respective lower sidewalls of the plurality of lower electrodes and comprising a first opening, and a second supporting pattern connected to respective upper sidewalls of the plurality of lower electrodes and comprising a second opening. A first distance between the first and second supporting patterns may be longer than a second distance between the first supporting pattern and respective bottom portions of the plurality of lower electrodes adjacent the substrate. For example, the first and second distances may be first and second vertical distances, respectively, and a ratio of the second vertical distance to the first vertical distance may range from about 1:1 to about 1:9.

In various embodiments, the first supporting pattern may include a first thickness that is substantially equivalent to or thinner than a second thickness of the second supporting pattern. In some embodiments, the second opening may overlap at least a portion of the first opening in plan view, and the first opening may include a first width that is wider than a second width of the second opening. Alternatively, the second opening may be offset from the first opening such that the first and second openings are non-overlapping in plan view.

A semiconductor device, according to various embodiments, may include a substrate and a plurality of capacitors. The plurality of capacitors may include a plurality of respective lower electrodes on the substrate, a dielectric film on surfaces of the plurality of lower electrodes, and an upper electrode on the dielectric film. The semiconductor device may include a first supporting pattern connected to lower sidewalls of the plurality of lower electrodes and including a first opening. Moreover, the semiconductor device may include a second supporting pattern connected to upper sidewalls of the plurality of lower electrodes and including a second opening. The second opening may overlap at least a portion of the first opening in plan view, and the first opening may include a first width that is wider than a second width of the second opening.

In various embodiments, the first supporting pattern may include a first thickness that is substantially equivalent to or thinner than a second thickness of the second supporting pattern. In some embodiments, a first vertical distance between the first and second supporting patterns may be longer than a second vertical distance between the first supporting pattern and respective bottom portions of the plurality of lower electrodes adjacent the substrate. For example, a ratio of the first vertical distance to the second vertical distance may range from about 1:1 to about 1:9. Moreover, in some embodiments, respective top surfaces of the plurality of lower electrodes may be substantially coplanar.

A method of forming a semiconductor device, according to various embodiments, may include forming a removable layer on a lower structure. The removable layer may include a semiconductor material or an oxide material. The method may include forming a buffer layer including an etch selectivity with respect to the removable layer, on a top surface of the removable layer. The method may include forming a supporting layer on the buffer layer to define an opening exposing the buffer layer. The method may include patterning the removable layer, the buffer layer, and the supporting layer to form a plurality of holes exposing the lower structure. The method may include forming a plurality of lower electrodes in the plurality of holes, respectively. The method may include removing the removable layer and buffer layer. Moreover, the method may include sequentially forming a dielectric film and an upper electrode on surfaces of the plurality of lower electrodes.

In various embodiments, the supporting layer may include a material including an etch selectivity with respect to the removable layer and the buffer layer. In some embodiments, the removable layer may include a single-crystalline silicon layer, an amorphous silicon layer, a doped silicon layer, a silicon germanium layer, or a carbon-based material. In some embodiments, the supporting layer may include one of silicon nitride (SiN), silicon carbide nitride (SiCN), tantalum oxide (TaO), or titanium dioxide ($TiO_2$). Moreover, forming the plurality of holes may include forming a sacrificial layer on the supporting layer to fill the opening, forming a mask pattern on the sacrificial layer, and sequentially and anisotropically etching the sacrificial layer, the supporting layer, the buffer layer, and the removable layer, using the mask pattern as an etch mask.

A method of forming a semiconductor device, according to various embodiments, may include forming a first structure including a first removable layer, a first buffer layer, and a first supporting layer sequentially stacked on a lower structure, the first supporting layer defining a first opening exposing the first buffer layer. The method may include forming a second structure including a second removable layer, a second buffer layer, and a second supporting layer sequentially stacked on the first structure, the second supporting layer defining a second opening exposing the second buffer layer. The method may include patterning the first and second structures to form a plurality of holes exposing the lower structure. The method may include forming a plurality of lower electrodes in the plurality of holes, respectively. The method may include removing the first and second buffer layers and the first and second removable layers. Moreover, the method may include sequentially forming a dielectric film and an upper electrode on surfaces of the plurality of lower electrodes.

In various embodiments, the first removable layer may include a first thickness that is thinner than a second thickness of the second removable layer. In some embodiments, the first opening may include a first width that is wider than a second width of the second opening. In some embodiments, the first supporting layer may include a first thickness that is thinner than or substantially equivalent to a second thickness of the second supporting layer. Moreover, the second opening may overlap at least a portion of the first opening in plan view. Alternatively, the second opening may be offset from the first opening such that the first and second openings are non-overlapping in plan view.

According to various embodiments, at least one of the first and second removable layers may include a single-crystalline silicon layer, an amorphous silicon layer, a doped silicon layer, a silicon germanium layer, or a carbon-based material. In some embodiments, the first and second supporting layers may include one of SiN, SiCN, TaO, and $TiO_2$. Moreover, forming the plurality of holes may include forming a sacrificial layer on the second removable structure to fill the second opening, forming a mask pattern on the sacrificial layer, and sequentially and anisotropically etching the sacrificial layer, the second removable structure, and the first removable structure using the mask pattern as an etch mask.

In various embodiments, removing the first and second buffer layers and the first and second removable layers may include performing a first isotropic etching process to remove the second buffer layer and to expose the second removable layer through the second opening. Removing the first and second buffer layers and the first and second removable layers may include performing a second isotropic etching process to remove the second mold layer exposed by the second opening and to expose upper portions of the plurality of lower electrodes and the first buffer layer through the first opening. Removing the first and second buffer layers and the first and second removable layers may include performing a third isotropic etching process to remove the first buffer layer and to expose the first removable layer through the first opening. Moreover, removing the first and second buffer layers and the first and second removable layers may include performing a fourth isotropic etching process to remove the first removable layer and to expose lower portions of the plurality of lower electrodes.

A method of forming a semiconductor device, according to various embodiments, may include forming a first removable layer on a substrate, where the first removable layer may include a semiconductor material or an oxide material. The method may include forming a first supporting layer on the first removable layer. The method may include forming a second removable layer on the first supporting layer, where the second removable layer may include a semiconductor material or an oxide material. The method may include forming a second supporting layer on the second removable layer. The method may include patterning the first and second removable layers and the first and second supporting layers to form a plurality of holes therein and to form first and second supporting patterns. The method may include forming a plurality of electrodes in the plurality of holes, respectively, after forming the first and second supporting patterns. Moreover, the method may include removing the first and second removable layers after forming the plurality of electrodes.

In various embodiments, the method may include forming first and second buffer layers on the first and second removable layers, respectively, before patterning the first and second supporting layers to form the first and second supporting patterns, respectively. Moreover, the method may include forming a sacrificial mask layer on the second buffer layer and then patterning the first and second supporting layers to form the first and second supporting patterns, respectively, before removing the sacrificial mask layer.

According to various embodiments, forming the plurality of electrodes may include forming a conductive material in each of the plurality of holes. In some embodiments, the plurality of electrodes may include a plurality of lower electrodes, and the method may include forming a dielectric film and an upper electrode on the plurality of lower electrodes. Moreover, the first and second supporting patterns may be adjacent lower and upper sidewalls, respectively, of the plurality of electrodes.

BRIEF DESCRIPTION OF THE DRAWINGS

The above and other features and advantages of the disclosure will become more apparent in view of the attached drawings and accompanying detailed description.

FIG. 1 is a plan view illustrating a semiconductor device according to some embodiments.

FIG. 2 is a sectional view illustrating a semiconductor device according to some embodiments and taken along line I-I' of FIG. 1.

FIG. 3 is a perspective view illustrating a semiconductor device according to some embodiments.

FIGS. 4 and 5 are plan and sectional views, respectively, illustrating a modified structure of a lower electrode that may be provided in a semiconductor device according to some embodiments.

FIG. 6 is a plan view illustrating a modified structure of supporting patterns that may be provided in a semiconductor device according to some embodiments.

FIG. 7 is a plan view illustrating a semiconductor device according to some embodiments.

FIG. 8 is a perspective view illustrating a semiconductor device according to some embodiments.

FIG. 9 is a plan view illustrating a semiconductor device according to some embodiments.

FIG. 10 is a perspective view illustrating a semiconductor device according to some embodiments.

FIGS. 11 through 19 are sectional views illustrating a method of fabricating a semiconductor device according to some embodiments and taken along line I-I' of FIG. 1.

FIGS. 20 and 21 are sectional views illustrating a method of forming supporting patterns that may be provided in a semiconductor device according to some embodiments.

FIG. 22 is a flow chart illustrating a method of fabricating a semiconductor device according to some embodiments.

FIGS. 23 through 29 are sectional views illustrating a method of fabricating a semiconductor device according to some embodiments.

FIG. 30 is a flow chart illustrating a method of fabricating a semiconductor device according to some embodiments.

FIGS. 31 through 36 are sectional views illustrating a method of fabricating a semiconductor device according to some embodiments.

FIG. 37 is a schematic block diagram illustrating a memory system including a semiconductor device according to some embodiments.

FIG. 38 is a schematic block diagram illustrating an example of an electronic system including a semiconductor memory device according to some embodiments.

DETAILED DESCRIPTION

Figure 1:
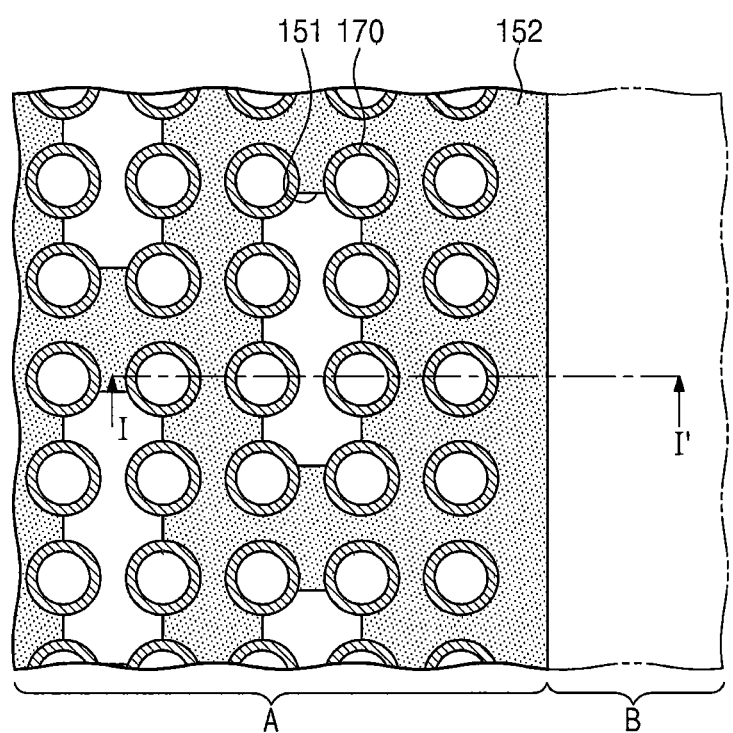
FIGS. 1 through 38 represent non-limiting, example embodiments as described herein.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
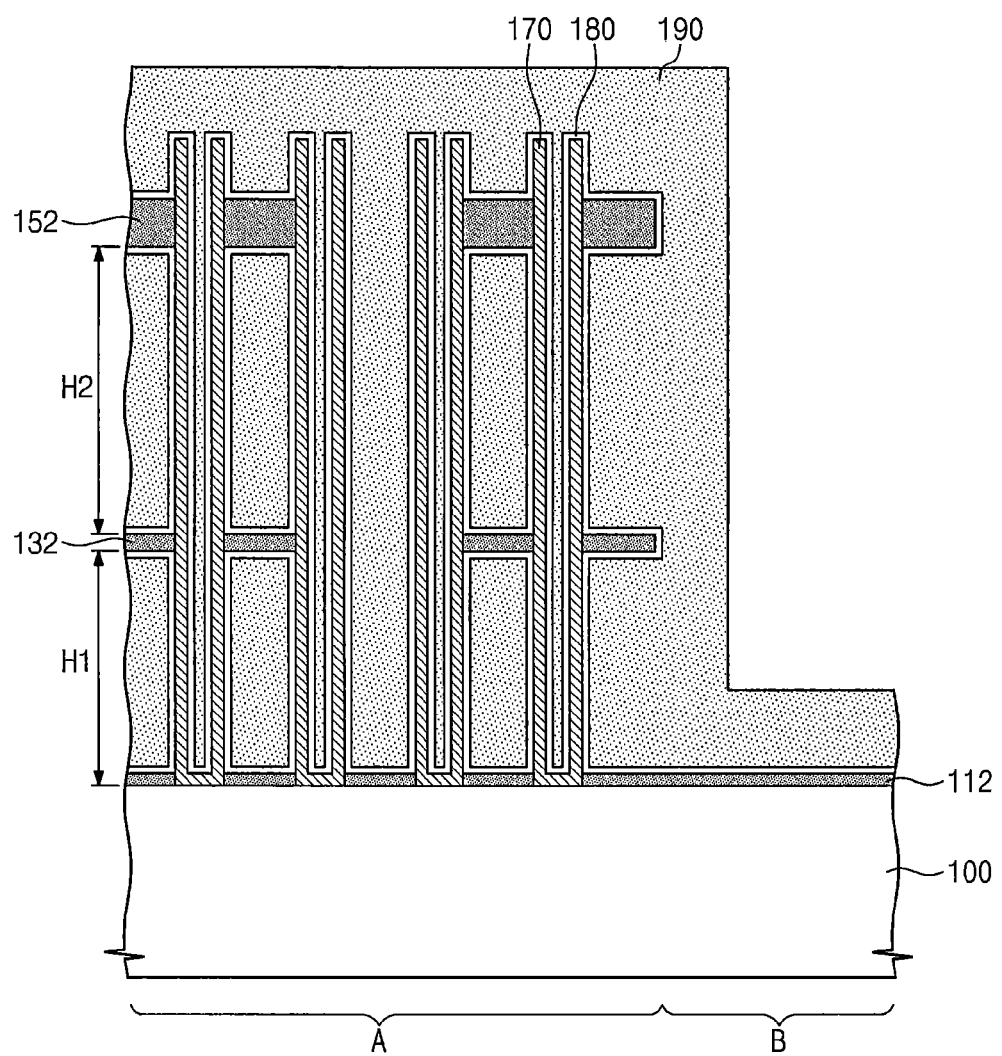

FIG. 1 is a plan view illustrating a semiconductor device according to some embodiments. FIG. 2 is a sectional view illustrating a semiconductor device according to some embodiments and taken along line I-I' of FIG. 1, and FIG. 3 is a perspective view illustrating a semiconductor device according to some embodiments.

Figure 4:
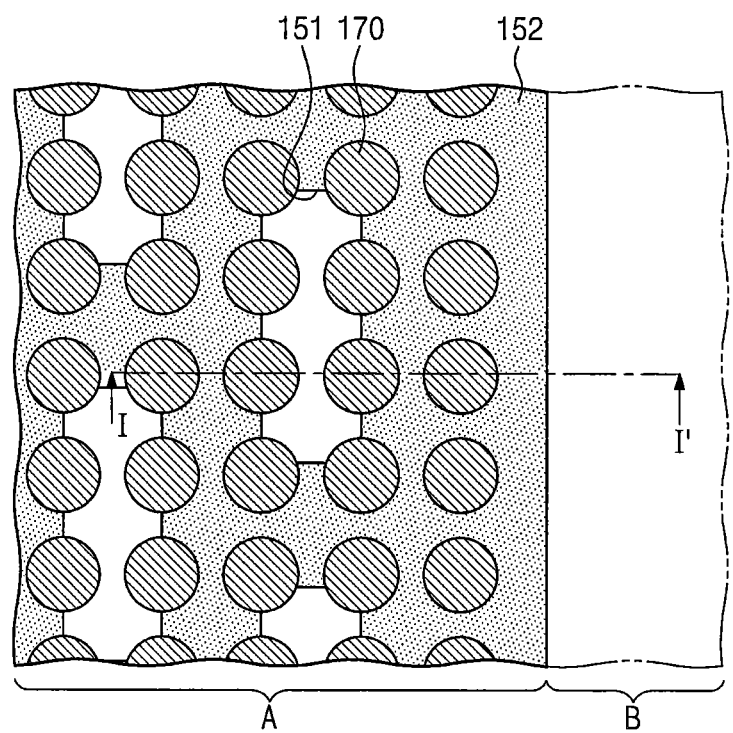
Figure 5:
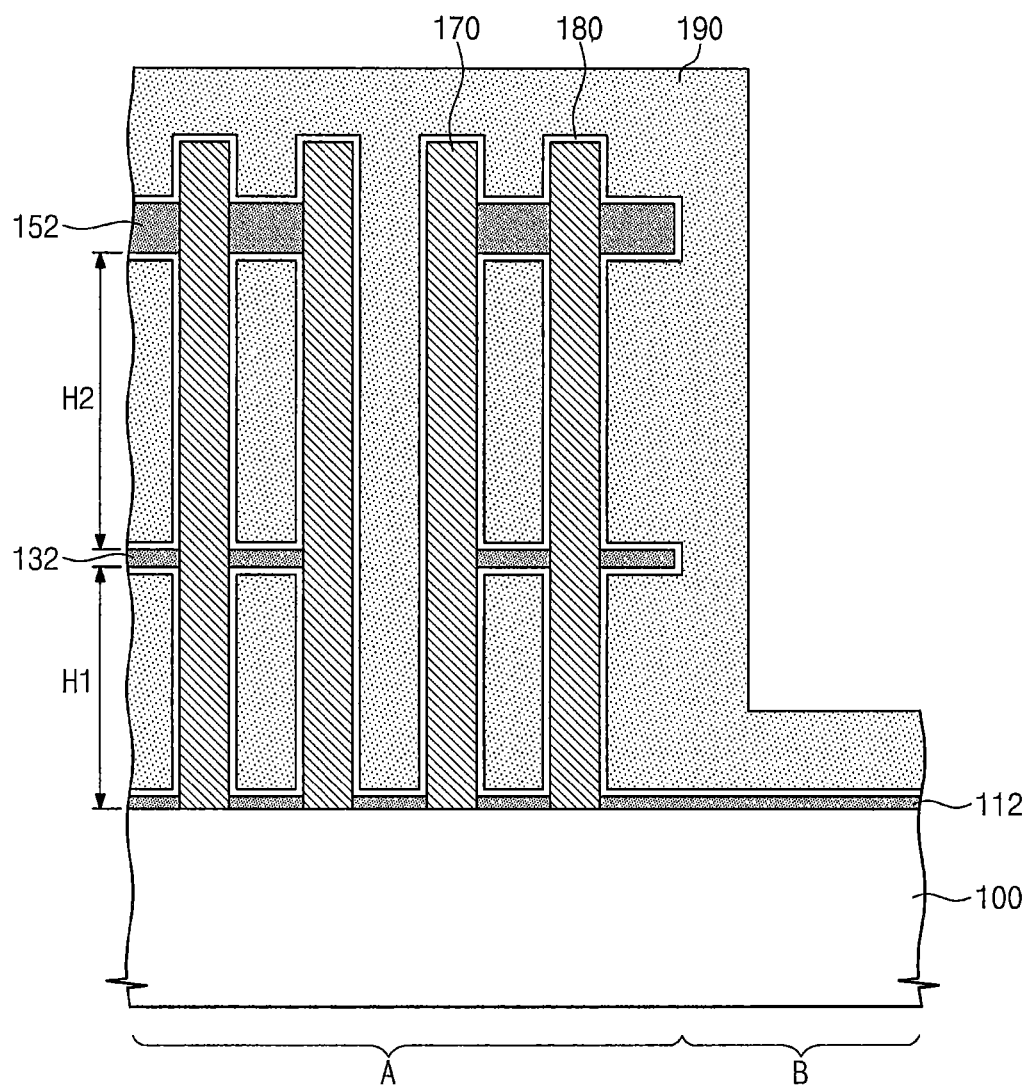
Figure 6:
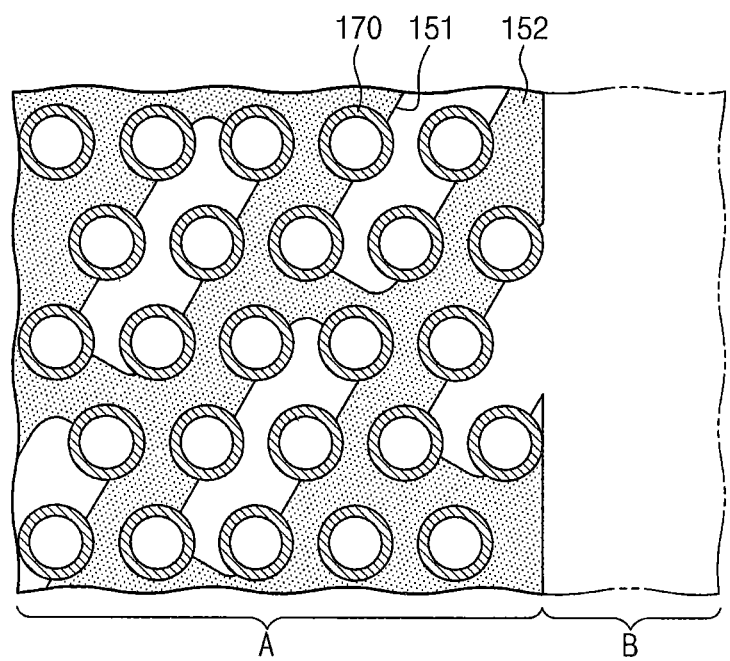

FIGS. 4 and 5 are plan and sectional views, respectively, illustrating a modified structure of a lower electrode that may be provided in a semiconductor device according to some embodiments. FIG. 6 is a plan view illustrating a modified structure of supporting patterns that may be provided in a semiconductor device according to some embodiments.

Figure 3:
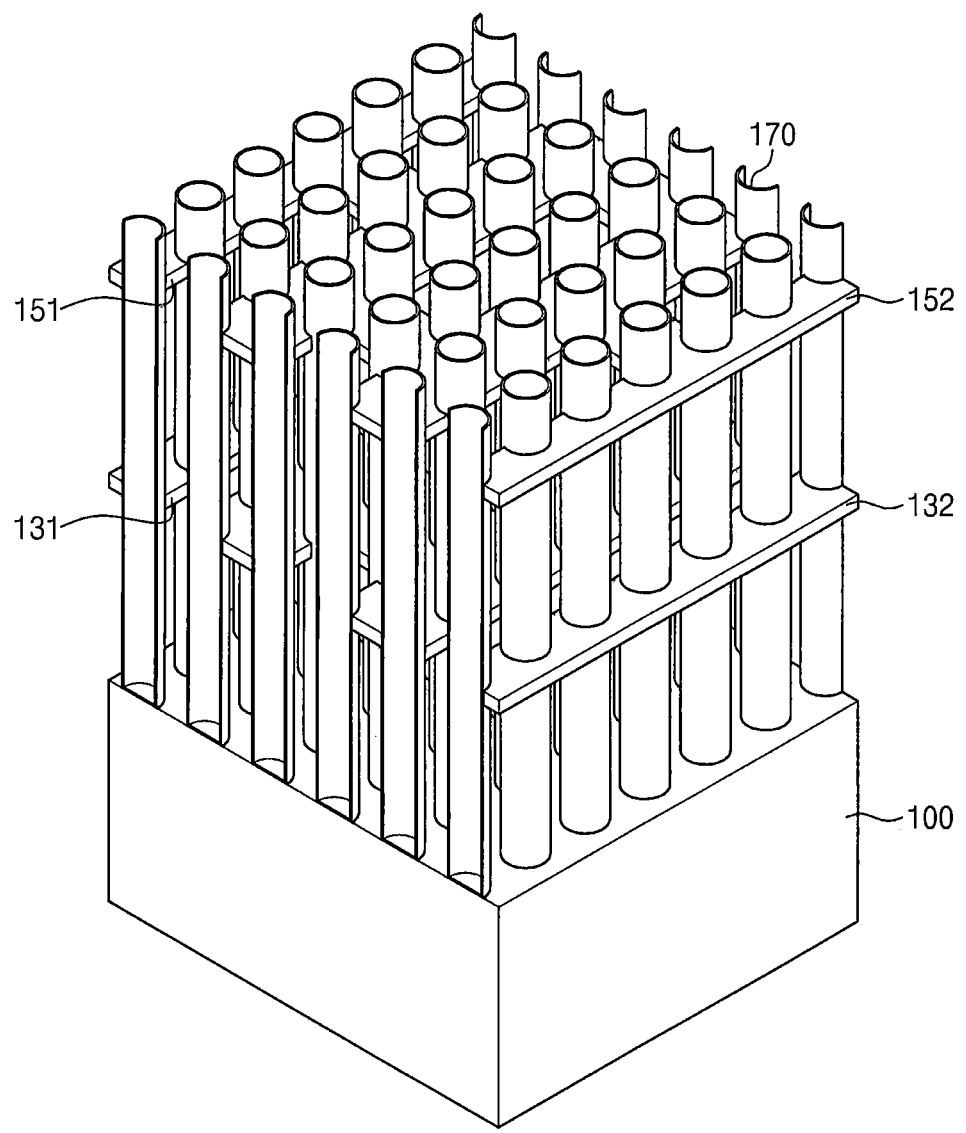

Referring to FIGS. 1 through 3, capacitors may be provided on a lower structure 100. The lower structure 100 may include a semiconductor substrate, semiconductor devices, and/or interlayer insulating layers. For example, the semiconductor substrate may include a cell region A, in which memory cells will be formed, and a peripheral circuit region B, in which peripheral circuits for controlling the memory cells will be formed. Semiconductor devices (for example, Metal Oxide Semiconductor (MOS) transistors, diodes, or resistors) may be provided on the semiconductor substrate. In some example embodiments, gate lines and bit lines may be formed on the cell region A of the semiconductor substrate. In addition, source/drain electrodes of a MOS transistor and contact plugs connected to gate lines may be formed on the cell region A of the semiconductor substrate.

The uppermost layer of the lower structure 100 may be an interlayer insulating layer with a planarized top surface, and lower electrodes 170 of capacitors may be provided on the interlayer insulating layer. For example, each of the capacitors may include a lower electrode 170, a dielectric film 180 and an upper electrode 190, and the lower electrode 170 may be electrically connected to a switching device provided in the lower structure 100.

In plan view, as shown in FIGS. 1 and 4, the lower electrodes 170 may be regularly arranged along both column and row directions. Alternatively, as shown in FIG. 6, the lower electrodes 170 may be provided to form a zigzag arrangement.

As shown in FIGS. 1 through 3, the lower electrode 170 may have a cylindrical structure including a bottom portion and a sidewall portion vertically extending from the bottom portion. The bottom and sidewall portions of the lower electrode 170 may have substantially the same thickness. Alternatively, as shown in FIGS. 4 and 5, the lower electrode 170 may have a pillar-shaped structure. In some embodiments, the width of the lower electrode 170 may be downwardly tapered. In other words, a lower width of the lower electrode 170 may be smaller than an upper width of the lower electrode 170. Furthermore, top surfaces of the lower electrodes 170 may be substantially coplanar with each other, and the lower electrodes 170 may be formed to have substantially the same upper width.

The lower electrodes 170 may be formed of at least one of metal materials, metal nitride layers and metal silicides. In some example embodiments, the lower electrode 170 may be formed of high melting point metals (such as cobalt, titanium, nickel, tungsten, and molybdenum). In some embodiments, the lower electrode 170 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In some embodiments, the lower electrode 170 may be formed of at least one selected from a group of noble metals consisting of platinum (Pt), ruthenium (Ru), and iridium (Ir). In some embodiments, the lower electrode 170 may be formed of a conductive noble metal oxide layer such as platinum oxide (PtO), ruthenium oxide ($RuO_2$), or iridium oxide ($IrO_2$) and a conductive oxide film such as strontium ruthenium oxide (SRO) ($SrRuO_3$), barium strontium ruthenium oxide (BSRO) ($BaSrRuO_3$), calcium ruthenium oxide (CRO) ($CaRuO_3$), or lanthanum strontium cobalt oxide (LSCO).

Considering that the capacitance of a capacitor is proportional to a surface area of the lower electrode 170, the lower electrode 170 may be formed to have an increased height. Accordingly, the lower electrode 170 may have an increased aspect ratio (or a ratio of a height of the lower electrode 170 to a width of the lower electrode 170). In some example embodiments, to protect/prevent the lower electrode 170 from bending or falling, first and second supporting patterns 132 and 152 may be provided to support horizontally sidewalls of the lower electrode 170. In other words, the first and second supporting patterns 132 and 152 may provide structural stability for a capacitor of a semiconductor device. The first and second supporting patterns 132 and 152 may be formed at different levels from each other. In some embodiments (e.g., as shown in FIG. 2), each of the lower electrodes 170 may be supported by two supporting patterns, but the number of the supporting patterns may be increased to three or more, as the aspect ratio of the lower electrode 170 increases.

In some example embodiments, the first supporting pattern 132 may be provided to support lower sidewalls of the lower electrodes 170 and have first openings 131 formed at predetermined regions. The second supporting pattern 152 may be provided to support upper sidewalls of the lower electrodes 170 and have second openings 151 formed at predetermined regions.

The first and second openings 131 and 151 may be formed to have a bar-shape, a rectangular structure, or a linear structure. However, the structures of the first and second openings 131 and 151 may be variously modified, and at least a portion of the sidewalls of the lower electrodes 170 may be connected to the first and second supporting patterns 132 and 152.

In some example embodiments, the first and second openings 131 and 151 may be formed at substantially the same position in plan view. In other words, the first and second openings 131 and 151 may be overlapped with each other in plan view. A minimum width of the first and second openings 131 and 151 may be greater than a space between the lower electrodes 170. In some example embodiments, the first and second openings 131 and 151 may be formed to have substantially the same width. Further, the first and second openings 131 and 151 may be formed parallel to one of column and row directions as shown in FIG. 1. Alternatively, the first and second openings 131 and 151 may be formed parallel to a diagonal direction as shown in FIG. 6.

Vertical positions of the first and second supporting patterns 132 and 152 may be variously changed. For example, a vertical distance H2 between the first and second supporting patterns 132 and 152 may be greater than or substantially equivalent to a vertical distance H1 between the first supporting pattern 132 and a bottom portion of the lower electrode 170 that is adjacent the lower structure 100. In some example embodiments, the first and second supporting patterns 132 and 152 may be provided in such a way that a ratio of H1 to H2 ranges from about 1:1 to about 1:9.

In some example embodiments, the first and second supporting patterns 132 and 152 may be formed to have different thicknesses from each other. For example, the first supporting pattern 132 may be thinner than the second supporting pattern 152. Alternatively, the first supporting pattern 132 may be formed to have substantially the same thickness as that of the second supporting pattern 152. In some example embodiments, the first supporting pattern 132 may have a thickness of about 100-500 Angstroms (Å), whereas the second supporting pattern 152 may have a thickness of about 300-1500 Å. The first and second supporting patterns 132 and 152 may be formed of at least one of silicon nitride (SiN), silicon carbide nitride (SiCN), tantalum oxide (TaO), or titanium dioxide ($TiO_2$).

A dielectric film 180 may be formed to cover a plurality of the lower electrodes 170 with a uniform thickness. Further, the dielectric film 180 may be formed to a uniform thickness on the first and second supporting patterns 132 and 152. The dielectric film 180 may be formed of, for example, any single film selected from the group consisting of a metal oxide, such as hafnium oxide ($HfO_2$), zirconium oxide ($ZrO_2$), aluminum oxide ($Al_2O_3$), lanthanum oxide ($La_2O_3$), tantalum oxide ($Ta_2O_3$), and titanium dioxide ($TiO_2$), and a dielectric material of perovskite structure, such as strontium titanate ($SrTiO_3$) (STO), $BaSrTiO_3$ (BST), barium titanate ($BaTiO_3$), PZT, lead lanthanum zirconate titanate (PLZT), or combinations thereof. The dielectric film 180 may have a thickness ranging from about 50 Å to about 150 Å.

The upper electrode 190 may be formed on the dielectric film 180 to cover a plurality of the lower electrodes 170. In embodiments where the lower electrode 170 has a cylindrical structure, the upper electrode 190 may fill an inner space of the lower electrode 170 provided with the dielectric film 180. The upper electrode 190 may include at least one of doped silicon, metal materials, metal nitrides, or metal silicides. For example, in some example embodiments, the upper electrode 190 may be formed of high melting point metals (such as, cobalt, titanium, nickel, tungsten and molybdenum). In some embodiments, the upper electrode 190 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In some embodiments, the upper electrode 190 may be formed of at least one selected from a group of noble metals consisting of platinum (Pt), ruthenium (Ru), and iridium (Ir). In some embodiments, the upper electrode 190 may be formed of a conductive noble metal oxide layer, such as platinum oxide (PtO), ruthenium dioxide ($RuO_2$), or iridium oxide ($IrO_2$), and a conductive oxide film, such as SRO ($SrRuO_3$), BSRO ($BaSrRuO_3$), CRO ($CaRuO_3$), or LSCO.

Figure 7:
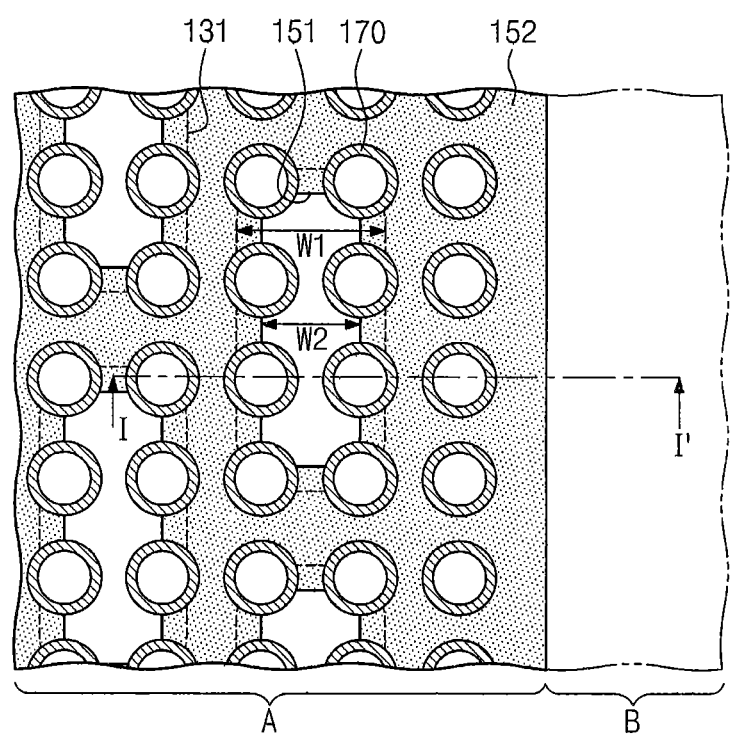
Figure 8:
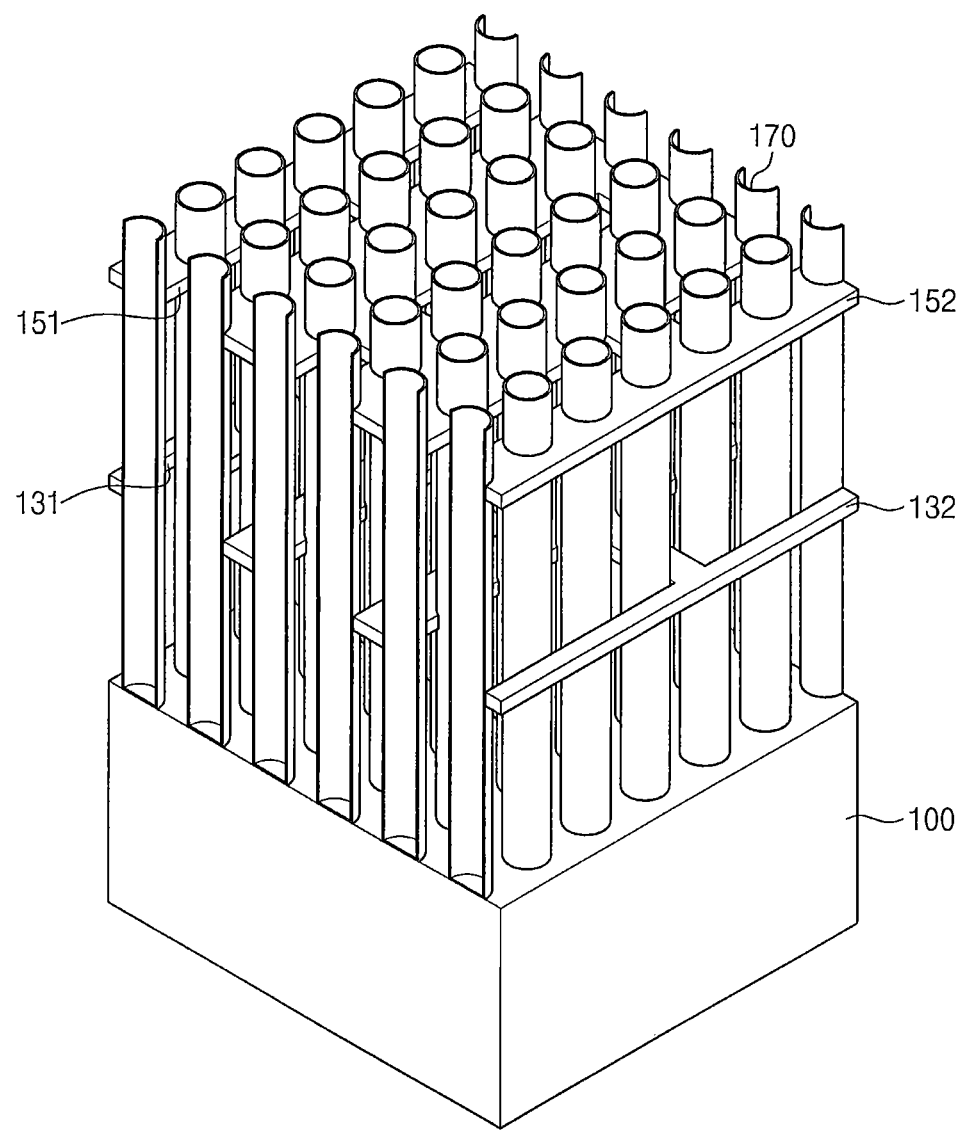

FIG. 7 is a plan view illustrating a semiconductor device according to some example embodiments. FIG. 8 is a perspective view illustrating a semiconductor device according to some example embodiments. For the sake of brevity, again, the elements and features of FIGS. 7 and 8 that are similar to those previously shown and described with reference to FIGS. 1 through 3 may not be described in much further detail.

Referring to FIGS. 7 and 8, the first and second supporting patterns 132 and 152 may be provided at different levels to support the lower electrodes 170. The first supporting pattern 132 may be connected to lower portions of the lower electrodes 170 to have the first openings 131 formed at predetermined regions. The second supporting pattern 152 may be connected to upper portions of the lower electrodes 170 to have the second openings 151 formed at predetermined regions.

As illustrated in FIGS. 7 and 8, the first opening 131 and the second opening 151 may have different widths from each other. For example, as shown in FIG. 7, a width W1 of the first opening 131 may be greater than a width W2 of the second opening 151. Alternatively, in some embodiments, the width W1 of the first opening 131 may be smaller than the width W2 of the second opening 151. The minimum width of the first and second openings 131 and 151 may be greater than a space between the lower electrodes 170 adjacent each other.

In addition, as described with reference to FIG. 2, vertical positions of the first and second supporting patterns 132 and 152 may be variously changed. For example, a vertical distance H2 between the first and second supporting patterns 132 and 152 may be greater than or substantially equivalent to a vertical distance H1 between the first supporting pattern 132 and a bottom portion of the lower electrode 170 that is adjacent the lower structure 100.

Figure 9:
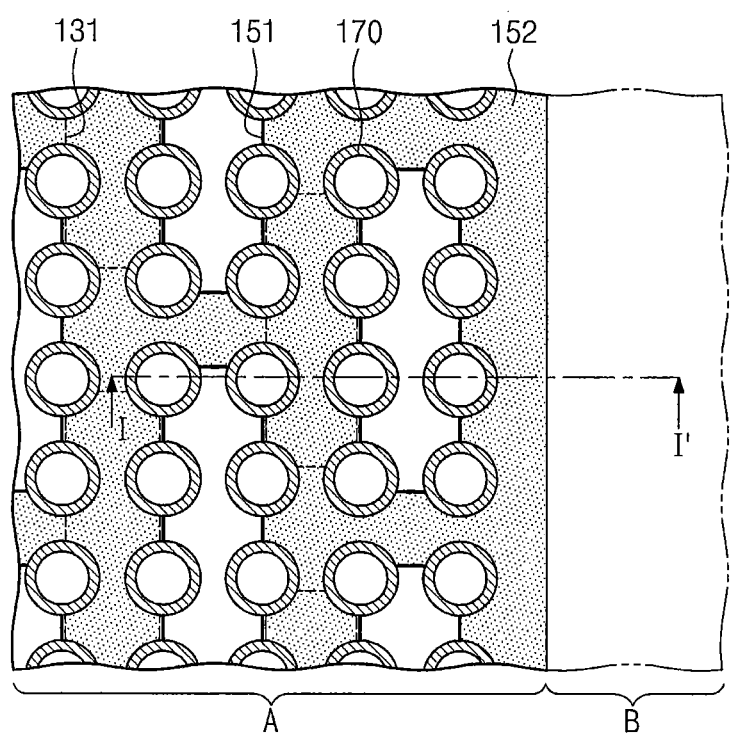
Figure 10:
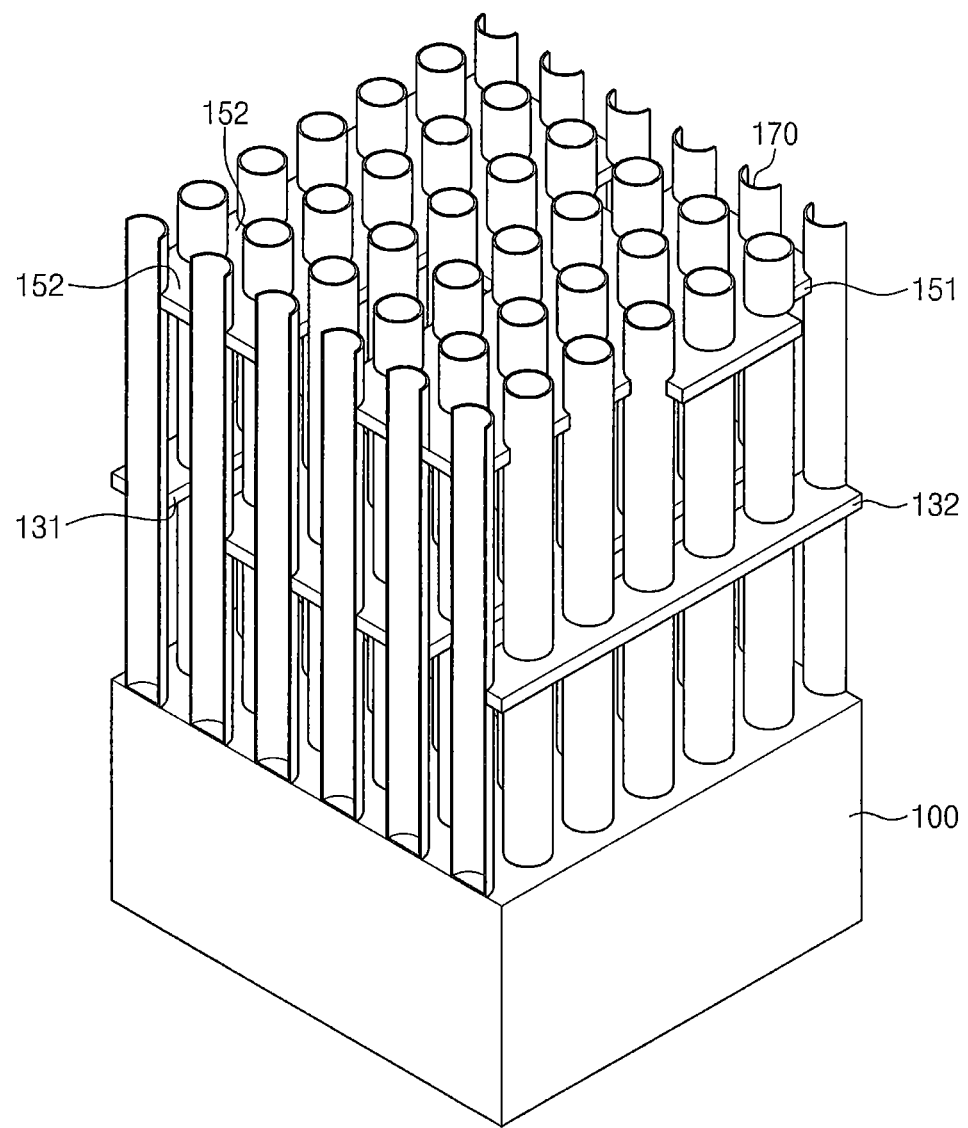

FIG. 9 is a plan view illustrating a semiconductor device according to some example embodiments. FIG. 10 is a perspective view illustrating a semiconductor device according to some example embodiments. For the sake of brevity, again, the elements and features of FIGS. 9 and 10 that are similar to those previously shown and described with reference to FIGS. 1 through 3 may not be described in much further detail.

Referring to FIGS. 9 and 10, the first and second supporting patterns 132 and 152 may be provided at different levels to support the lower electrodes 170. The first and second supporting patterns 132 and 152 may be connected to portions of sidewalls of the lower electrodes 170 to have openings formed at predetermined regions. According to FIG. 9, in plan view, the first openings 131 of the first supporting pattern 132 may be formed at positions deviating from positions of the second openings 151 of the second supporting pattern 152. In other words, as shown in the plan view of FIG. 9, the first and second openings 131, 151 may be offset from each other, in plan view. For example, the entire or most portions of the first opening 131 may not be overlapped with the second opening 151. That is, according to FIGS. 9 and 10, the first and second supporting patterns 132 and 152 may be formed at different vertical levels from each other, in plan view, without any limitation in horizontal positions of the first and second openings 131 and 151 thereof.

To overcome technical difficulties resulting from a high aspect ratio of the lower electrodes 170 during the formation of a capacitor, the lower electrodes 170 may be formed using a mold layer formed with lower electrode holes. In some embodiments, to increase the capacitance of the capacitor, the mold layer may be formed to an increased thickness. However, the increase in thickness of the mold layer may lead to an increase in aspect ratio of the lower electrode 170, and thus the lower electrodes 170 may be toppled. To protect/prevent the lower electrode 170 from toppling, the first and second supporting patterns 132 and 152 may be formed to support lower and upper sidewalls of the lower electrodes 170.

Figure 20:
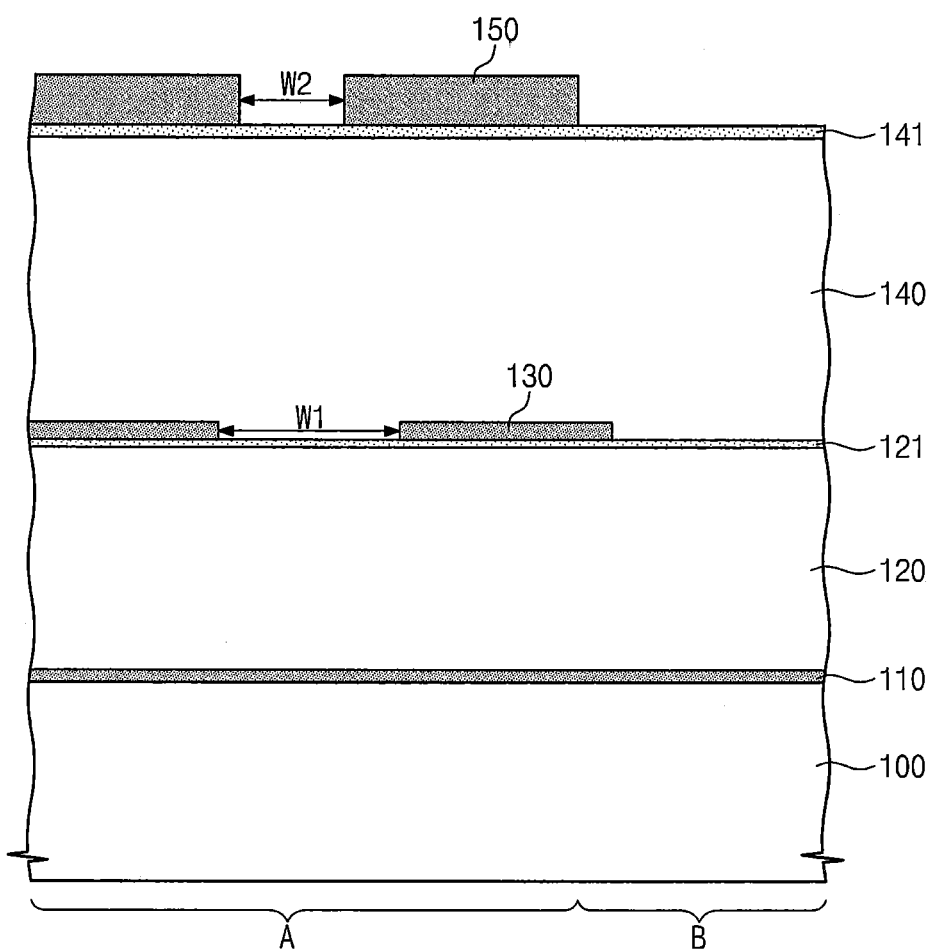
Figure 21:
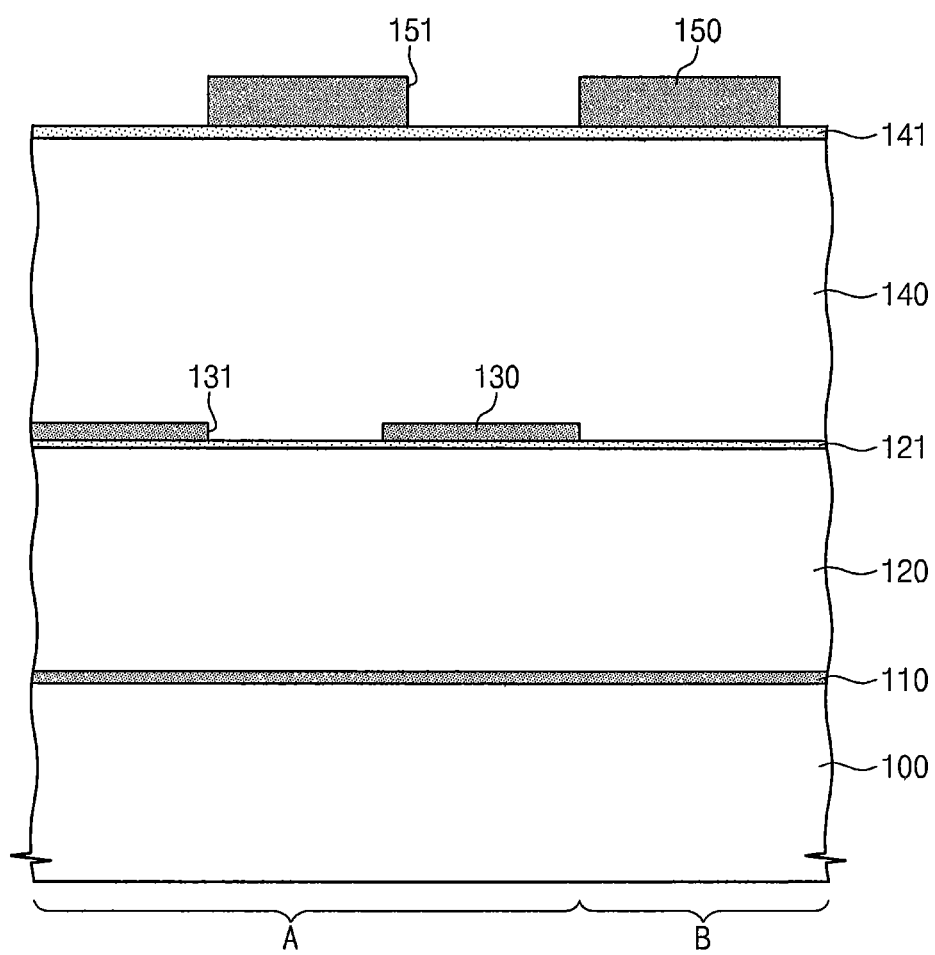

A method of fabricating a semiconductor device with capacitors is described with reference to FIGS. 11 through 21. FIGS. 11 through 19 are sectional views illustrating a method of fabricating a semiconductor device according to some example embodiments. In detail, FIGS. 11 through 19 are sectional views taken along line I-I' of FIG. 1. FIGS. 20 and 21 are sectional views illustrating a method of forming supporting patterns that may be provided in a semiconductor device according to some example embodiments.

Figure 11:
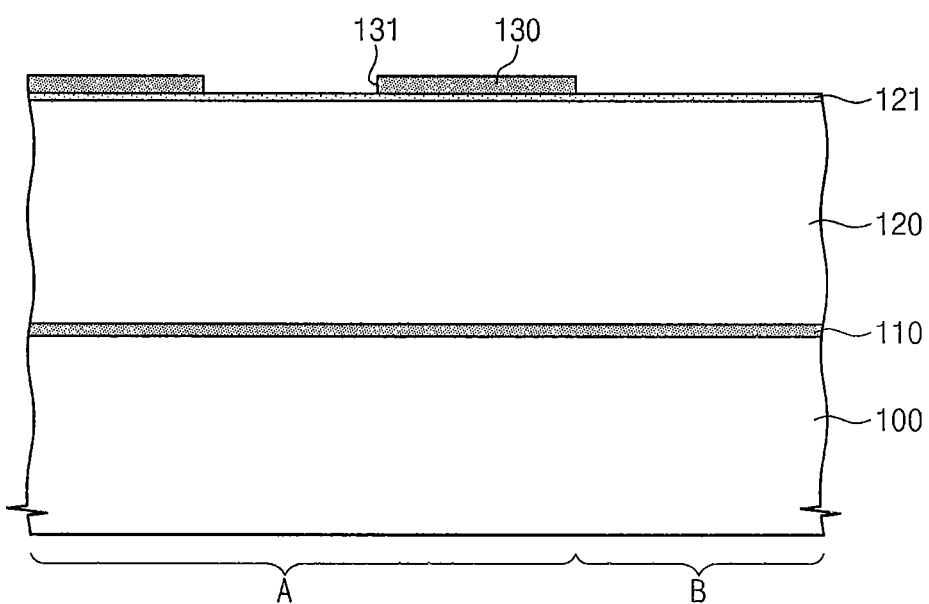

Referring to FIG. 11, the lower structure 100 is provided and may include a semiconductor substrate, semiconductor devices, and interlayer insulating layers. For example, the semiconductor substrate may include a cell region A, in which memory cells will be formed, and a peripheral circuit region B, in which peripheral circuits for controlling the memory cells will be formed. The semiconductor devices may include, for example, MOS transistors, diodes, and resistors. In some example embodiments, gate lines and bit lines may be formed on the cell region A of the semiconductor substrate. In addition, source/drain electrodes of the MOS transistor and contact plugs connected to the gate lines may be formed on the cell region A of the semiconductor substrate.

The uppermost layer of the lower structure 100 may be an interlayer insulating layer with a planarized top surface. The interlayer insulating layer may include at least one of high density plasma (HDP) oxide, TEOS (TetraEthylOrthoSilicate), PE-TEOS (Plasma Enhanced TetraEthylOrthoSilicate), ozone ($O_3$)-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or any combination thereof. Alternatively, the interlayer insulating layer may include at least one of silicon nitride, silicon oxynitride, or low-k materials.

Next, as shown in FIG. 11, a first mold structure may be formed on the lower structure 100. The first mold structure may include a first mold layer 120, a first buffer layer 121, and a first supporting layer 130 with the first opening 131 that are sequentially stacked on the lower structure 100.

In some example embodiments, the first mold layer 120 may be formed of a semiconductor material. For example, the first mold layer 120 may be formed of a single-crystalline silicon layer, an amorphous silicon layer, a doped silicon layer, a silicon germanium layer, or a carbon-based material. Alternatively, the first mold layer 120 may be formed of a silicon oxide layer. In some example embodiments, the first mold layer 120 may be formed to a thickness of about 5000 Å-10000 Å. The first mold layer 120 may be formed using a deposition process, such as a chemical vapor deposition (CVD) or a physical vapor deposition (PVD).

Furthermore, before the formation of the first mold layer 120, an etch stop layer 110 may be formed on the planarized top surface of the lower structure 100. The etch stop layer 110 may be formed of a material having an etch selectivity with respect to the planarized interlayer insulating layer and the first mold layer 120. For example, the etch stop layer 110 may be formed of a silicon nitride layer or a silicon oxynitride layer.

Figure 14:
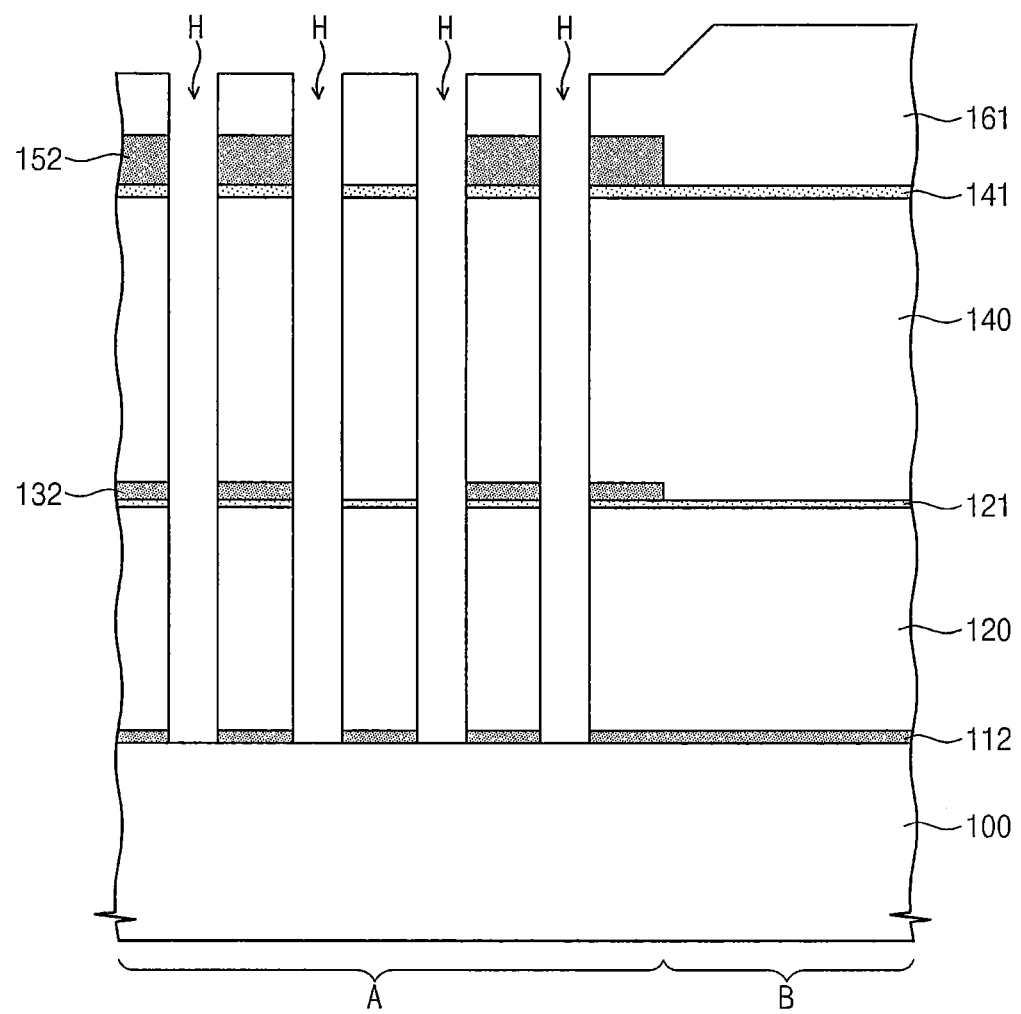

In some example embodiments, the first buffer layer 121 may be formed on the top surface of the first mold layer 120. The first buffer layer 121 may be formed of a material having an etch selectivity with respect to the first mold layer 120 and the first supporting pattern 132. For example, the first buffer layer 121 may be formed of one selected from the group consisting of a silicon oxide layer, a silicon oxynitride layer, a silicon carbide layer, and a silicon carbon nitride layer. The first buffer layer 121 may be formed using a deposition process, such as a chemical vapor deposition (CVD) or a physical vapor deposition (PVD). The first buffer layer 121 may be formed to a thickness of about 50 Å-200 Å. The first buffer layer 121 may be used as the etch stop layer 110 in a process of forming the first supporting layer 131 on the first buffer layer 121, thereby protecting/preventing first and second mold layers 120 and 140 from being damaged during subsequent processes (e.g., a process of forming first and second supporting patterns as illustrated in FIG. 14).

Next, the first supporting layer 130 may be formed to define the first openings 131 exposing the first buffer layer 121. For example, the formation of the first supporting layer 130 may include forming a supporting layer on the first buffer layer 121, forming a mask pattern on the supporting layer to define openings, and anisotropically etching a supporting layer using a mask pattern as a mask.

The first supporting layer 130 may be formed of a material having an etch selectivity with respect to the first buffer layer 121 and first and second mold layers 120 and 140. In some example embodiments, the first supporting layer 130 may be formed of one of SiN, SiCN, TaO, and TiO$_2$. The first supporting layer 130 may be formed to a thickness of about 100 Å-500 Å.

The anisotropic etching process for forming the first supporting layer 130 may be performed using a plasma etching process. For example, in embodiments where the first supporting layer 130 is formed of a silicon nitride layer and the first buffer layer 121 is formed of a silicon-containing layer, the plasma etching process may be performed using a carbon-fluorine (CxFy)-based or carbon-hydrogen-fluorine (CxHyFz)-based etching gas. Here, the first buffer layer 121 provided below the first supporting layer 130 may be used as an etch stop layer. Accordingly, it may be possible to protect/prevent the first mold layer 120 from being exposed during the anisotropic etching process. The first buffer layer 121 may protect/prevent a surface of the first mold layer 120 from being damaged by high energy plasma.

As a result, the first supporting layer 130 may include the first openings 131 exposing the first buffer layer 121 on the cell region A. Further, the first supporting layer 130 may expose the first buffer layer 121 on the peripheral circuit region B. For example, the first supporting layer 130 may include the first openings 131 shaped like a bar, as shown in FIG. 11. The bar-shaped first openings 131 may be arranged along both column and row directions or may have a zigzag arrangement. Alternatively, the first supporting layer 130 may be formed to have the first openings 131 shaped like a line.

Figure 12:
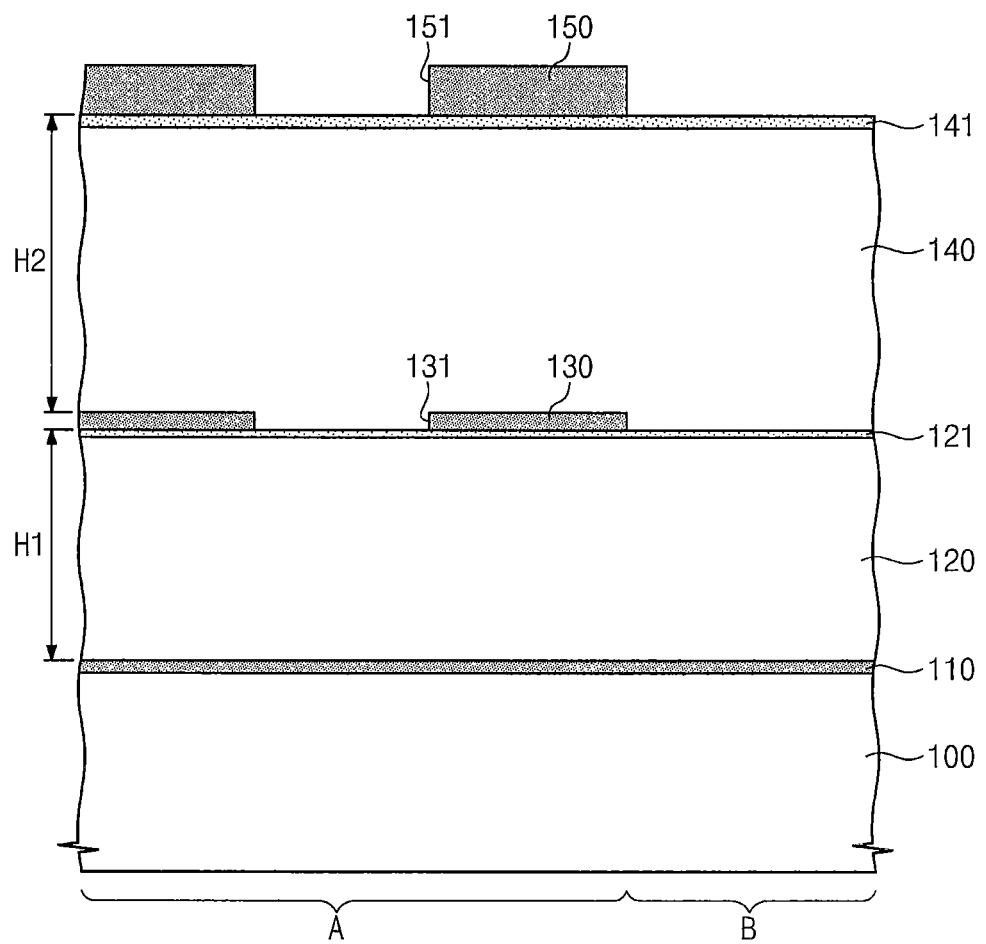

Referring to FIG. 12, a second mold structure may be formed on the first mold structure to include a second supporting layer 150, which may have the second mold layer 140, a second buffer layer 141, and the second opening 151. In some example embodiments, the second mold layer 140 may be formed on the first supporting layer 130 to fill the first openings 131. The second mold layer 140 may be formed of the same material as the first mold layer 120 or of a material exhibiting a difference of etch rate of 10% or less, during a process of forming lower electrode holes (e.g., as illustrated in FIG. 14). In some example embodiments, the second mold layer 140 may be formed of a semiconductor material. For example, the second mold layer 140 may be formed of a single-crystalline silicon layer, an amorphous silicon layer, a doped silicon layer, a silicon germanium layer, or a carbon-based material. Alternatively, the second mold layer 140 may be formed of a silicon oxide layer. The second mold layer 140 may be formed using a deposition process, such as a chemical vapor deposition (CVD) or a physical vapor deposition (PVD).

In some example embodiments, a thickness of the second mold layer 140 may be substantially equivalent to or greater than that of the first mold layer 120. In some example embodiments, a ratio of the thickness of the first mold layer 120 to the thickness of the second mold layer 140 may range from about 1:1 to about 1:9. For example, the second mold layer 140 may be formed to a thickness of about 5000 Å to 15000 Å.

In some example embodiments, the second buffer layer 141 may be formed on the second mold layer 140. The second buffer layer 141 may be formed of a material having an etch selectivity with respect to the second mold layer 140 and the second supporting layer 150. The second buffer layer 141 may be formed of the same material as the first buffer layer 121. For example, the second buffer layer 141 may be formed of one selected from the group consisting of a silicon oxide layer, a silicon oxynitride layer, a silicon carbide layer, and a silicon carbon nitride layer. The second buffer layer 141 may be formed using a deposition process, such as a chemical vapor deposition (CVD) or a physical vapor deposition (PVD).

In some example embodiments, a thickness of the second buffer layer 141 may be substantially equivalent to or greater than that of the first buffer layer 121. For example, the second buffer layer 141 may be formed to a thickness of about 100 Å-500 Å. The second buffer layer 141 may be used as an etch stop layer in a process of forming the second openings 151, thereby protecting/preventing the second mold layer 140 from being damaged by high energy plasma when the second supporting layer 150 is anisotropically etched.

Next, the second supporting layer 150 may be formed to include the second openings 151 exposing the second buffer layer 141. For example, the formation of the second supporting layer 150 may include forming a supporting layer on the second buffer layer 141, forming a mask pattern defining openings on the supporting layer, and anisotropically etching the supporting layer using the mask pattern as an etch mask.

The second supporting layer 150 may be formed of a material capable of having an etch selectivity (for example, a low etch rate) in a subsequent process of removing the first and second mold layers 120 and 140. In some example embodiments, the second supporting layer 150 may be formed of one of SiN, SiCN, TaO, and $TiO_2$. A thickness of the second supporting layer 150 may be substantially equivalent to or greater than that of the first supporting layer 130. For example, a ratio of the thickness of the first supporting layer 130 to the thickness of the second supporting layer 150 may range from about 1:1 to about 1:5. For example, the second supporting layer 150 may be formed to a thickness of about 300 Å-1500 Å.

The anisotropic etching process for forming the second supporting layer 150 may be performed using a plasma etching process. For example, in embodiments where the second supporting layer 150 is formed of a silicon nitride layer and the second buffer layer 141 is formed of a silicon-containing layer, the plasma etching process may be performed using $C_xF_y$-based or $C_xH_yF_z$-based etching gas. Here, the second buffer layer 141 may be used as an etch stop layer. Accordingly, it may be possible to protect/prevent the second mold layer 140 from being exposed during the anisotropic etching process.

As a result, the second supporting layer 150 may include the second openings 151 exposing the second buffer layer 141 on the cell region A. Further, the second supporting layer 150 may expose the second buffer layer 141 on the peripheral circuit region B. During the anisotropic etching process, the second buffer layer 141 provided below the second supporting layer may be used as an etch stop layer 110. Accordingly, it may be possible to protect/prevent the second mold layer 140 from being exposed during the anisotropic etching process.

As shown in FIG. 12, the second supporting layer 150 may include the second openings 151 shaped like a bar. The bar-shaped second openings 151 may be arranged along both column and row directions or to have a zigzag arrangement. Alternatively, the second supporting layer 150 may be patterned to have a line-shaped structure. In some example embodiments, the second openings 151 of the second supporting layer 150 may be formed on the first openings 131 of the first supporting layer 130, respectively. In other words, in plan view, the first openings 131 may be overlapped with the second openings 151. As illustrated in FIG. 12, the second openings 151 may be formed using the mask pattern for forming the first openings 131. In some example embodiments, a width of the second opening 151 of the second supporting layer 150 may be different from a width of the first opening 131 of the first supporting pattern 132. For example, referring to FIG. 20, a width W2 of the second opening 151 may be smaller than a width W1 of the first opening 131. Alternatively, in some embodiments, the width of the second opening 151 of the second supporting layer 150 may be greater than the width of the first opening 131 of the first supporting pattern 132. In some embodiments, as shown in FIG. 21, in plan view, the first opening 131 of the first supporting layer 130 may be formed to not be overlapped with the second opening 151 of the second supporting layer 150. For example, the second supporting layer 150 with the second openings 151 may be formed after forming the first supporting layer 130 with the first openings 131, and in some embodiments, the first openings 131 may be different from the second openings 151 in terms of planar positions and size.

In some embodiments, the first supporting pattern 132 may be formed after the formation of the second supporting pattern 152. However, in such embodiments, a thickness of the second supporting pattern 152 may be reduced during an anisotropic etching process of forming the first supporting pattern 132, and this may lead to a difficulty in increasing a vertical space between the first and second supporting patterns 132 and 152 to a desired value. For example, the vertical space between the first and second supporting patterns 132 and 152 may be smaller than that between the first supporting pattern 132 and a bottom portion of the lower electrode 170 that is adjacent the lower structure 100.

By contrast, according to some example embodiments, before the formation of the second supporting pattern 152, the first supporting pattern 132 may be formed below the second supporting pattern 152, and thus it may be possible to easily adjust the vertical space between the first and second supporting patterns 132 and 152. In addition, it may be possible to reduce/prevent production of side products and to reduce/prevent damage to the lower electrode 170 and the second supporting pattern 152, in an anisotropic etching process to form the first and second supporting patterns 132 and 152.

As described with reference to FIGS. 11 and 12, lower electrode holes H may be formed after the formation of the first and second mold structures on the lower structure 100. For example, referring to FIG. 13, a mask structure 160 for forming the lower electrode holes H may be formed on the second buffer layer 141 provided with the second supporting layer 150. Because the first and second mold layers 120 and 140 may be thick, the formation of the lower electrode holes H may be performed using the mask structure 160 having a high etch selectivity with respect to the first and second mold layers 120 and 140. For example, the mask structure 160 may be formed of materials having an etch selectivity with respect to the first and second mold layers 120 and 140 and the first and second supporting layers 130 and 150 in an anisotropic etching process to form the lower electrode holes H.

Figure 13:
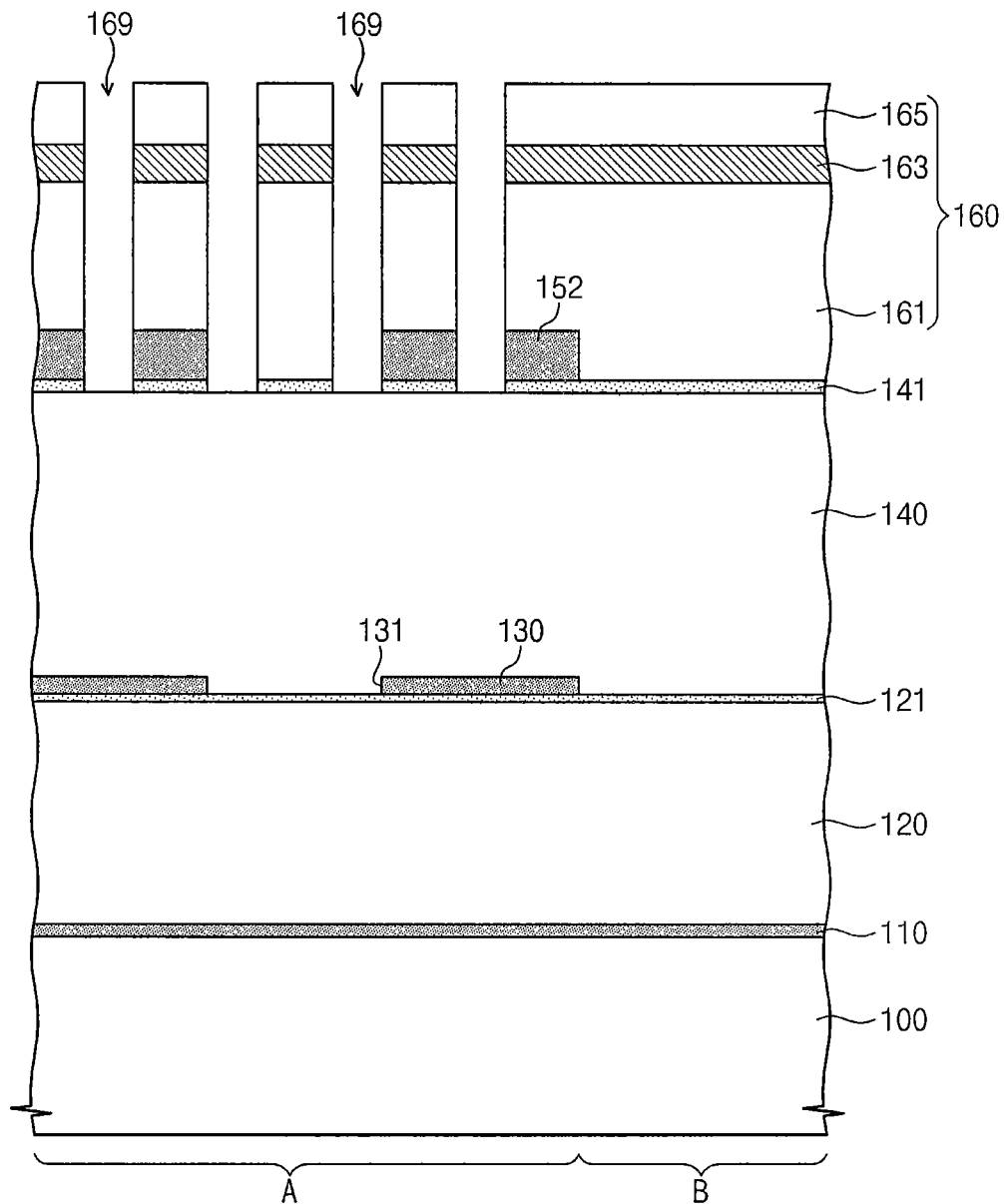

The mask structure 160 may be formed to define openings 169 that are arranged in column and row directions, as shown in FIG. 13. Alternatively, the openings 169 of the mask structure 160 may be parallel to a diagonal direction and be formed to have a zigzag arrangement, as shown in FIG. 6.

For example, the mask structure 160 may include a sacrificial mask layer 161, a hard mask layer 163, and an organic mask layer 165 that are sequentially stacked. The formation of the mask structure 160 may include patterning the organic mask layer 165 using a mask pattern as an etch mask, and then anisotropically etching the hard mask layer 163 and the sacrificial mask layer 161 using the patterned organic mask layer 165 as an etch mask.

The sacrificial mask layer 161 may be formed to fill the second openings 151 of the second supporting layer 150.

The sacrificial mask layer 161 may be formed of a material having an etch selectivity with respect to the first and second mold layers 120 and 140 and the first and second supporting layers 130 and 150. In some example embodiments, the sacrificial mask layer 161 may be formed of the same material as the second buffer layer 141. For example, the sacrificial mask layer 161 may be formed of a silicon oxide layer (e.g., high density plasma (HDP) oxide, TEOS (Tetra Ethyl Ortho Silicate), PE-TEOS (Plasma Enhanced TEOS), $O_3$-TEOS, and USG (Undoped Silicate Glass)).

The hard mask layer 163 may be formed of an inorganic material having an etch selectivity with respect to the sacrificial mask layer 161 in a process of etching the sacrificial mask layer 161. For example, the hard mask layer 163 may be formed of a silicon-containing material selected from the group consisting of polysilicon, silicon oxynitride (SiON), silicon nitride ($Si_3N_4$), or silicon carbide nitride (SiCN).

The organic mask layer 165 may be formed of an organic material having an etch selectivity with respect to the hard mask layer 163 in a process of etching the hard mask layer 163. For example, the organic mask layer 165 may be formed of a spin-on hardmask (SOH) layer or an amorphous carbon layer (ACL). The SOH layer may include a carbon-based SOH layer or a silicon-based SOH layer.

Next, the mask structure 160 with the openings 169 may be used to anisotropically etch the second supporting layer and the second buffer layer 141. Accordingly, the second supporting pattern 152 may be formed to define the second openings and the holes. A top surface of the second mold layer 140 may be exposed by an over-etching in the anisotropic etching process of the second supporting layer. After the formation of the second supporting pattern 152, the organic mask layer 165 may be removed by an ashing process.

Referring to FIG. 14, the lower electrode holes H may be formed through the first and second mold structures to expose the lower structure 100. For example, the second mold layer 140, the first supporting pattern 132, and the first mold layer 120 may be sequentially and anisotropically etched using the mask structure 160 as an etch mask to form the lower electrode holes H.

The anisotropic etching process for forming the lower electrode holes H may be performed using an etch recipe, in which a difference in etch rate between the first and second mold layers 120 and 140 and the first and second supporting layers 130 and 150 may be less than 10%. In addition, the anisotropic etching process for forming the lower electrode holes H may be performed using an etching gas for etching the first and second mold layers 120 and 140 and an etching gas for etching the first supporting pattern 132.

For example, the formation of the lower electrode holes H may include anisotropically etching the second mold layer 140 using plasma to expose the first supporting layer 130, anisotropically etching the first supporting layer 130 using plasma, and anisotropically etching the first mold layer 120 using plasma. During the anisotropic etching of the first supporting layer 130, the etching gas for etching the first supporting layer 130 may result in damage to an exposed sidewall of the second mold layer 140 or production of polymers. Accordingly, a passivation layer may be formed on the sidewall of the second mold layer 140, before the anisotropic etching of the first supporting layer 130. For example, the passivation layer may be formed by performing an oxygen plasma treatment on the exposed sidewall of the second mold layer 140.

If the lower electrode holes H have a high aspect ratio, then the hard mask layer 163 may be removed and the sacrificial mask layer 161 may have a recessed top surface. Further, the sacrificial mask layer 161 remaining on the second supporting pattern 152 may be used as a mold for forming lower electrodes.

The lower electrode holes H may be arranged along column and row directions, as shown in FIG. 1 (which illustrates the lower electrodes 170 that are formed in the holes H), in plan view. Alternatively, the lower electrode holes H may be parallel to a diagonal direction and be formed to have a zigzag arrangement, as shown in FIG. 6, in plan view. The lower electrode holes H may have a smaller width at a lower portion thereof than at an upper portion thereof, as a result of the anisotropic etching process. During the formation of the lower electrode holes H, the etch stop layer 110 may be over-etched and partially removed to form an etch stop pattern 112 exposing the top surface of the lower structure 100.

Figure 15:
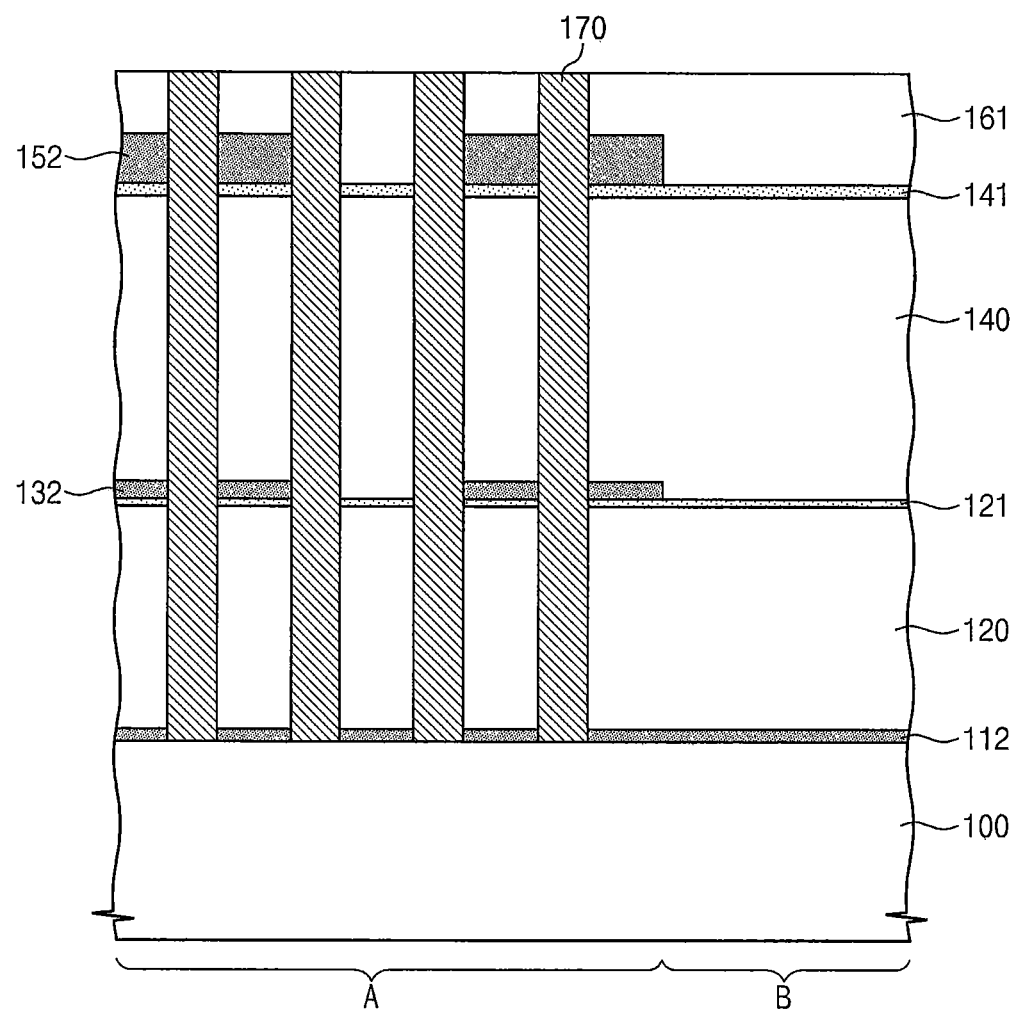

Referring to FIG. 15, the lower electrodes 170 may be formed in the lower electrode holes H. The formation of the lower electrodes 170 may be formed by depositing a conductive layer in the lower electrode holes H and performing a planarization process to remove the conductive layer from a top surface of the sacrificial mask layer 161 and to separate the lower electrodes 170 from each other.

The conductive layer may be formed using a deposition process having a good step coverage property, such as a chemical vapor deposition (CVD) process, a physical vapor deposition (PVD), or an atomic layer deposition (ALD) process. In some example embodiments, the conductive layer may be formed to have a thickness greater than half a width of each of the lower electrode holes H, thereby filling the lower electrode holes H completely. Accordingly, as shown in FIG. 15, the lower electrodes 170 may be formed to have a pillar-shaped structure. Alternatively, in some example embodiments, the conductive layer may be formed to have a thickness smaller than half the width of each of the lower electrode holes H, thereby covering conformally an inner surface of each of the lower electrode holes H. In such embodiments, after the deposition of the conductive layer, a sacrificial layer may be formed on the conductive layer to fill remaining spaces of the lower electrode holes H, and thus, as shown in FIG. 2, the lower electrodes 170 may be formed to have a cylindrical structure.

In some example embodiments, the conductive layer may include at least one of metal materials, metal nitrides, or metal silicides. For example, the conductive layer may be formed of high melting point metals (such as, cobalt, titanium, nickel, tungsten, and molybdenum). In some embodiments, the conductive layer may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In some embodiments, the conductive layer may be formed of at least one selected from a group of noble metals consisting of platinum (Pt), ruthenium (Ru), and iridium (Ir). In some embodiments, the conductive layer may be formed of a conductive noble metal oxide layer such as PtO, $RuO_2$ or $IrO_2$ and a conductive oxide film such as SRO ($SrRuO_3$), BSRO ($BaSrRuO_3$), CRO ($CaRuO_3$), or LSCO.

After the deposition of the conductive layer, a plasma treatment process and/or a thermal treatment process may be performed to remove impurities or by-products that may be produced during the deposition of the conductive layer. The plasma treatment process may be performed using nitrogen ($N_2$) and hydrogen ($H_2$) plasma.

The planarization process may be, for example, a chemical mechanical polishing process or a dry etch-back process. As a result of the planarization process, the lower electrodes may have top surfaces that are coplanar with that of the sacrificial mask layer.

According to some example embodiments, the first and second supporting patterns 132 and 152 may be formed before the formation of the lower electrodes 170, and thus it may possible to protect/prevent the lower electrodes 170 from being exposed to the etching gas that is used for forming the first and second supporting patterns 132 and 152. In addition, even if side products (for example, non-volatile polymer (e.g., titanium fluoride ($TiF_x$))) are produced by the etching gas used for forming the first and second supporting patterns 132 and 152, they may not remain on portions of the first and second mold layers 120 and 140, and thus it may be possible to easily remove the first and second mold layers 120 and 140 in a subsequent process.

Figure 16:
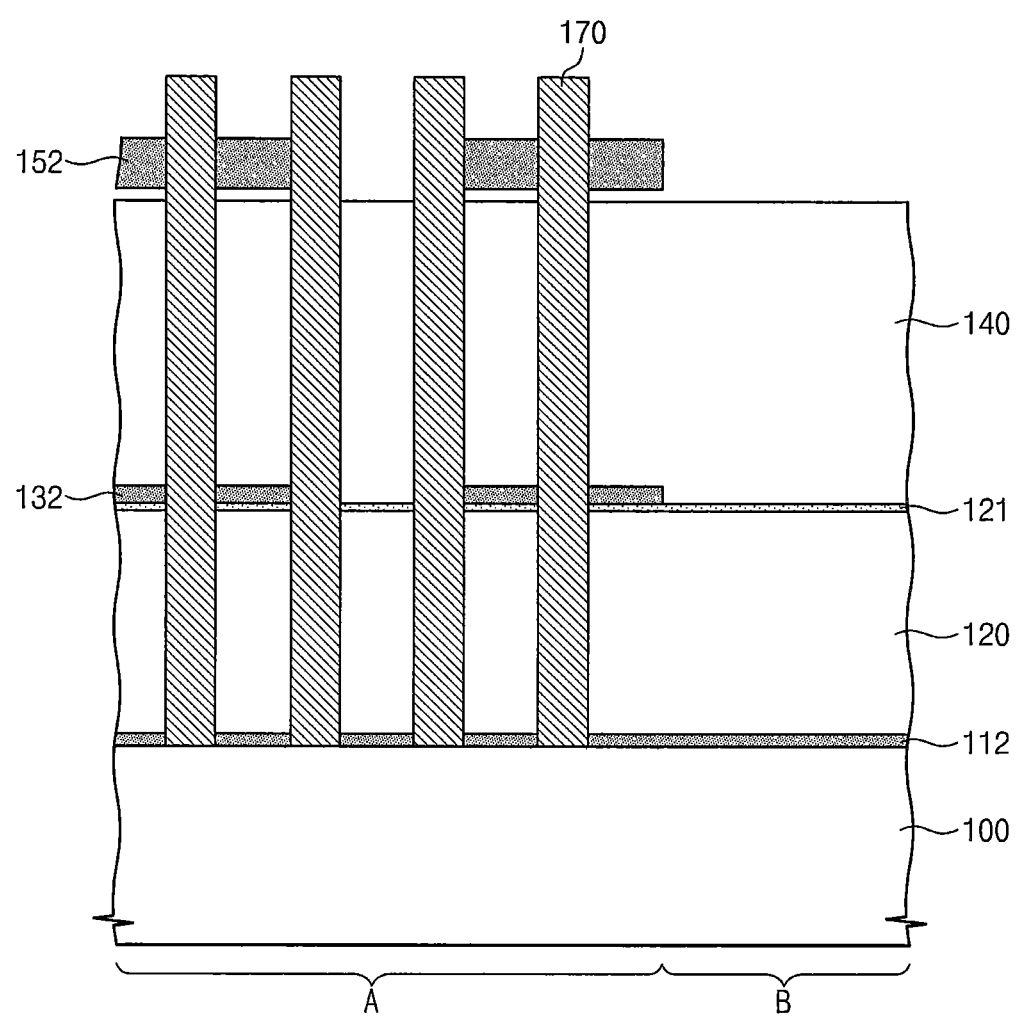
Figure 17:
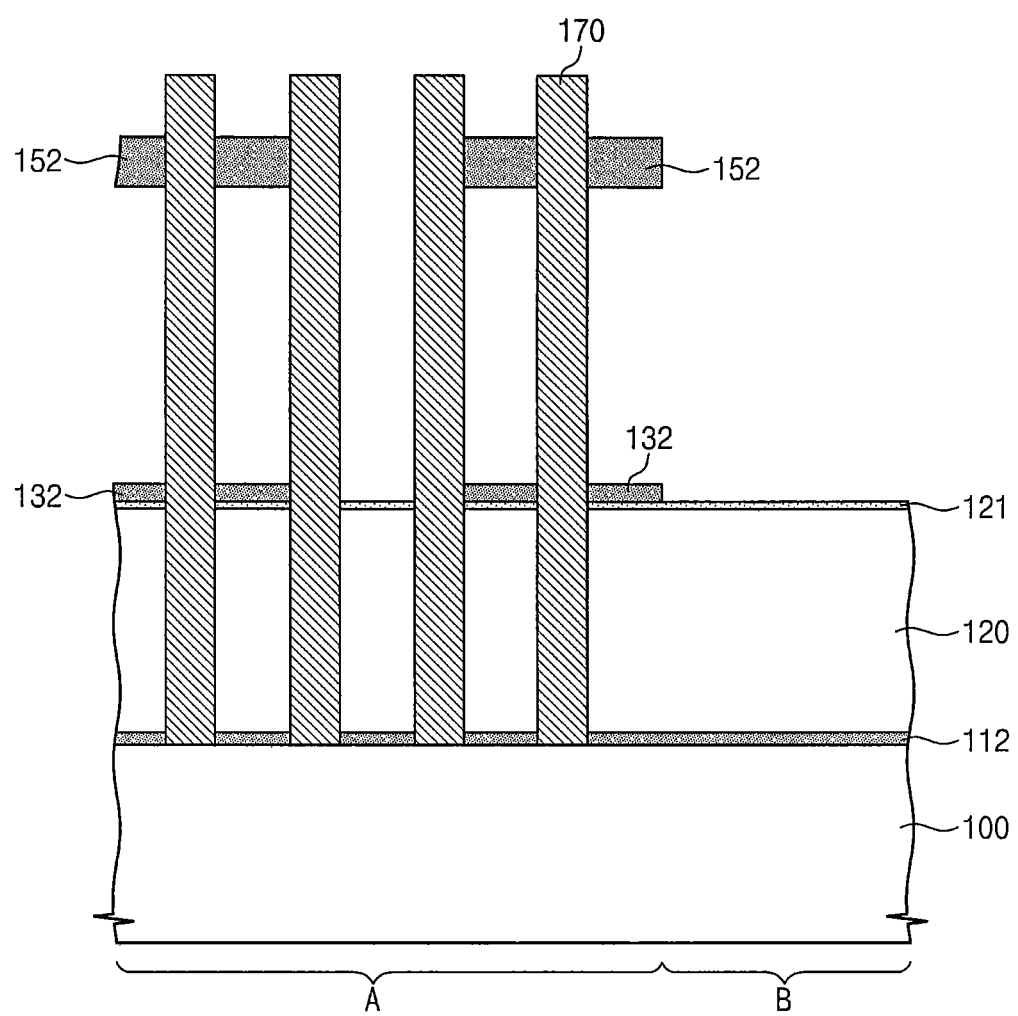
Figure 18:
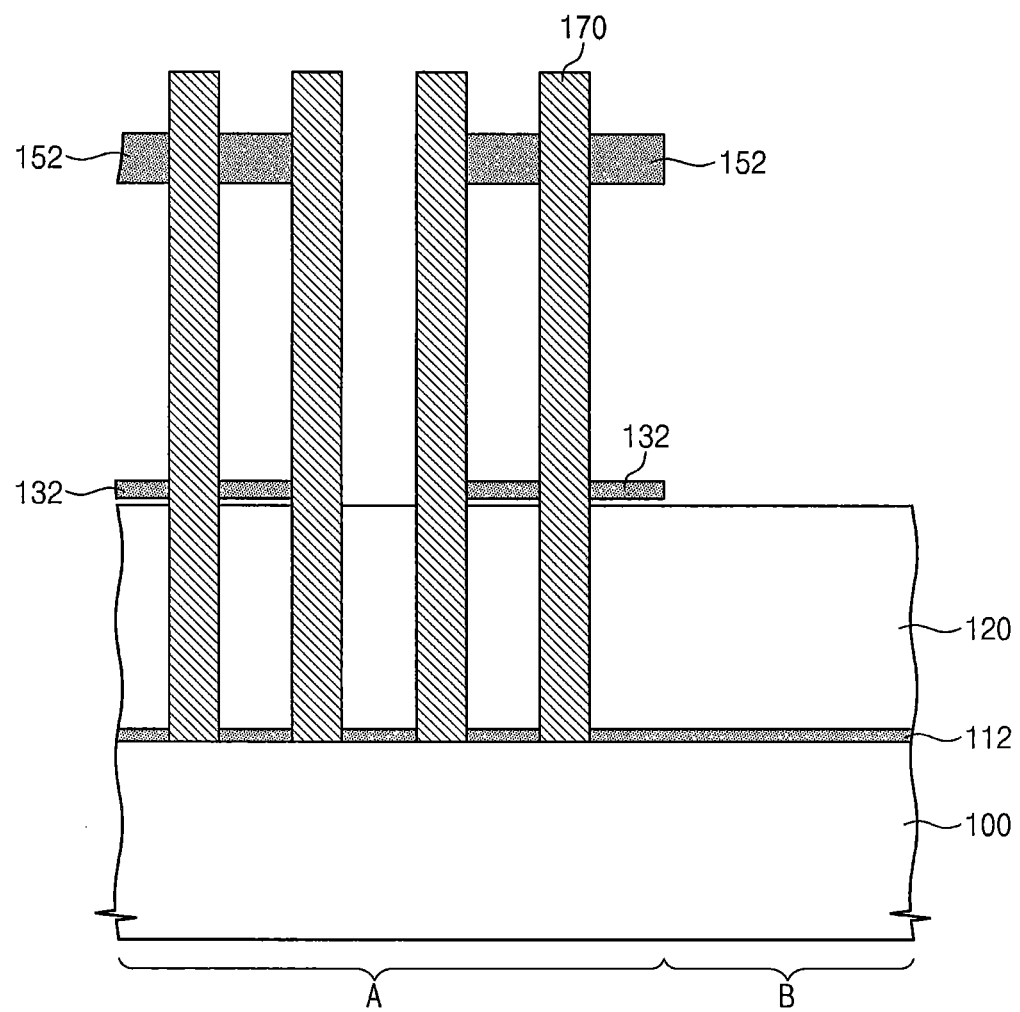

Referring to FIGS. 16 through 18, the first and second mold layers 120 and 140 and the first and second buffer layers 121 and 141 may be removed. Referring to FIG. 16, the sacrificial mask layer 161 exposed by the planarization process may be removed to expose the second supporting pattern 152. In some example embodiments, because the second supporting pattern 152 with the second openings 151 may be formed before the removal of the sacrificial mask layer 161, the top surface of the second buffer layer 141 may be exposed on the peripheral circuit region B and the second openings 151 of the second supporting pattern 152 in the removal process of the sacrificial mask layer 161.

In some example embodiments, the removal process of the sacrificial mask layer 161 may be performed using an etch recipe, in which a difference in etch rate between the second buffer layer 141 and the sacrificial mask layer 161 may be less than 10% in the removal process of the sacrificial mask layer 161, and have an etch selectivity with respect to the second supporting pattern 152. Accordingly, the second buffer layer 141 exposed by the second openings 151 of the second supporting pattern 152 may be removed during the removal process of the sacrificial mask layer 161. In other words, the sacrificial mask layer 161 and the second buffer layer 141 may be simultaneously removed to expose the top surface of the second mold layer 140 and the bottom surface of the second supporting pattern 152.

The sacrificial mask layer 161 and the second buffer layer 141 may be removed using a wet etching process. In some example embodiments, if the sacrificial mask layer 161 and the second buffer layer 141 are formed of a silicon oxide layer, then the wet etching process may be performed using a limulus amoebocyte lysate (LAL) solution.

In some example embodiments, because the second supporting pattern 152 with the second openings 151 may be formed before the removal of the sacrificial mask layer 161, it may be possible to reduce/prevent damage to the top surface of the second mold layer 140 in the etching process for forming the second supporting pattern 152.

Next, the second mold layer 140 may be removed to expose the upper sidewalls of the lower electrodes 170, as shown in FIG. 17. The removal of the second mold layer 140 may be performed using an etch recipe having an etch selectivity with respect to the first supporting pattern 132 and the first buffer layer 121. The removal of the second mold layer 140 may be performed by supplying a wet etching solution to the second mold layer 140 exposed at the second openings 151 and the peripheral circuit region B. In some example embodiments, if the second mold layer 140 is formed of a silicon-based material, then the removal of the second mold layer 140 may be performed using an etching solution (such as potassium hydroxide (KOH), ammonium hydroxide ($NH_4OH$), sodium hydroxide (NaOH), or tetramethyl ammonium hydroxide (TMAH)).

In some example embodiments, because the first supporting pattern 132 with the first openings 131 may be formed before the removal of the second mold layer 140, the top surface of the first buffer layer 121 may be exposed through the peripheral circuit region B and the first openings 131 in the process of removing the second mold layer 140.

Next, the first buffer layer 121 exposed by the first supporting pattern 132 may be removed. The removal of the first buffer layer 121 may be performed using an etch recipe having an etch selectivity with respect to the first and second supporting patterns 132 and 152 and the first mold layer 120. The first buffer layer 121 may be removed by a wet etching process and, if the first buffer layer 121 is formed of a silicon oxide layer, the first buffer layer 121 may be removed by supplying a limulus amoebocyte lysate (LAL) solution to the top surface of the first buffer layer 121 exposed by the first supporting pattern 132. Accordingly, as shown in FIG. 18, the top surface of the first mold layer 120 may be exposed by the first supporting pattern 132.

In some example embodiments, because the first supporting pattern 132 with the first openings 131 may be formed before the removal of the first mold layer 120, it may be possible to protect/prevent the lower electrodes 170 and the second supporting pattern 152 from being damaged or removed in an etching process for forming the first supporting pattern 132.

Figure 19:
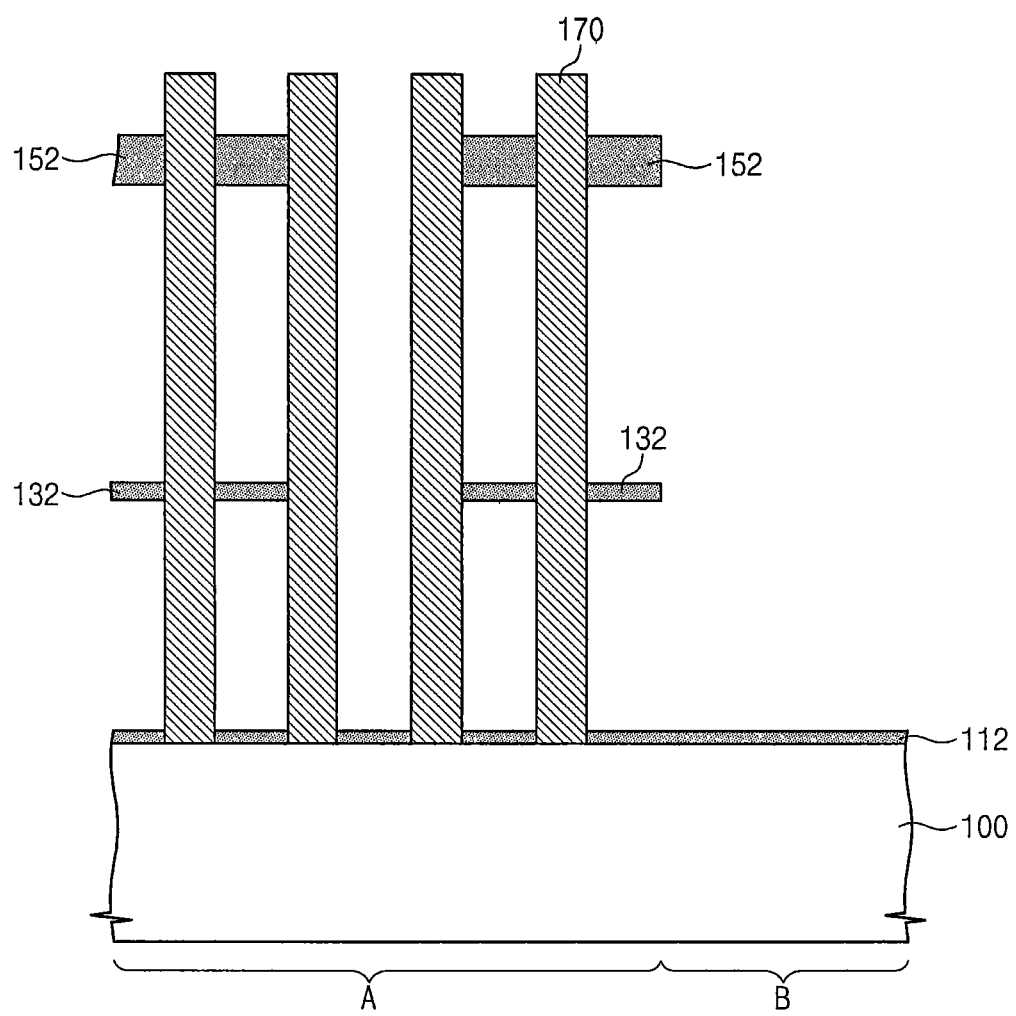

Referring to FIG. 19, the first mold layer 120 may be removed to expose the lower sidewalls of the lower electrodes 170. The removal of the first mold layer 120 may be performed using an etch recipe having an etch selectivity with respect to the first and second supporting patterns 132 and 152 and the etch stop pattern 112.

In some example embodiments in which the first mold layer 120 is formed of a silicon-based material, the removal of the first mold layer 120 may be performed using an etching solution (such as potassium hydroxide (KOH), ammonium hydroxide ($NH_4OH$), sodium hydroxide (NaOH), or tetramethyl ammonium hydroxide (TMAH)).

As a result of the removal of the first mold layer 120, the lower electrodes 170 with exposed sidewalls may be formed on the lower structure 100. In addition, the lower electrodes 170 with a high aspect ratio may be horizontally supported by the first and second supporting patterns 132 and 152, and thus it may possible to protect/prevent the lower electrodes 170 from falling.

Next, referring back to FIG. 2, the dielectric film 180 and the upper electrode 190 may be sequentially formed on the lower electrodes 170. The dielectric film 180 and the upper electrode 190 may be formed using a deposition process having a good step coverage property, such as a chemical vapor deposition (CVD) process, a physical vapor deposition (PVD) process, or an atomic layer deposition (ALD) process.

The dielectric film 180 may be formed of, for example, any single film selected from the group consisting of metal oxide, such as $HfO_2$, $ZrO_2$, $Al_2O_3$, $La_2O_3$, $Ta_2O_3$, and $TiO_2$, and a dielectric material of perovskite structure, such as $SrTiO_3$ (STO), $BaSrTiO_3$ (BST), $BaTiO_3$, PZT, PLZT, or combinations thereof. Further, the dielectric film 180 may be formed to a thickness of about 50 Å-150 Å.

The upper electrode 190 may include at least one of doped silicon, metal materials, metal nitrides, or metal silicides. For example, in some example embodiments, the upper electrode 190 may be formed of high melting point metals (such as cobalt, titanium, nickel, tungsten, and molybdenum). In some embodiments, the upper electrode 190 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In some embodiments, the upper electrode 190 may be formed of at least one selected from a group of noble metals consisting of platinum (Pt), ruthenium (Ru), and iridium (Ir)). In some embodiments, the upper electrode 190 may be formed of a conductive noble metal oxide layer, such as PtO, $RuO_2$, or $IrO_2$, and a conductive oxide film, such as SRO ($SrRuO_3$), BSRO ($BaSrRuO_3$), CRO ($CaRuO_3$), or LSCO. After the formation of the upper electrode 190, a plasma treatment process and/or a thermal treatment process may be performed to remove impurities or by-products that may be produced during the deposition of the upper conductive layer. The plasma treatment process may be performed using $N_2$ and $H_2$ plasma.

Figure 22:
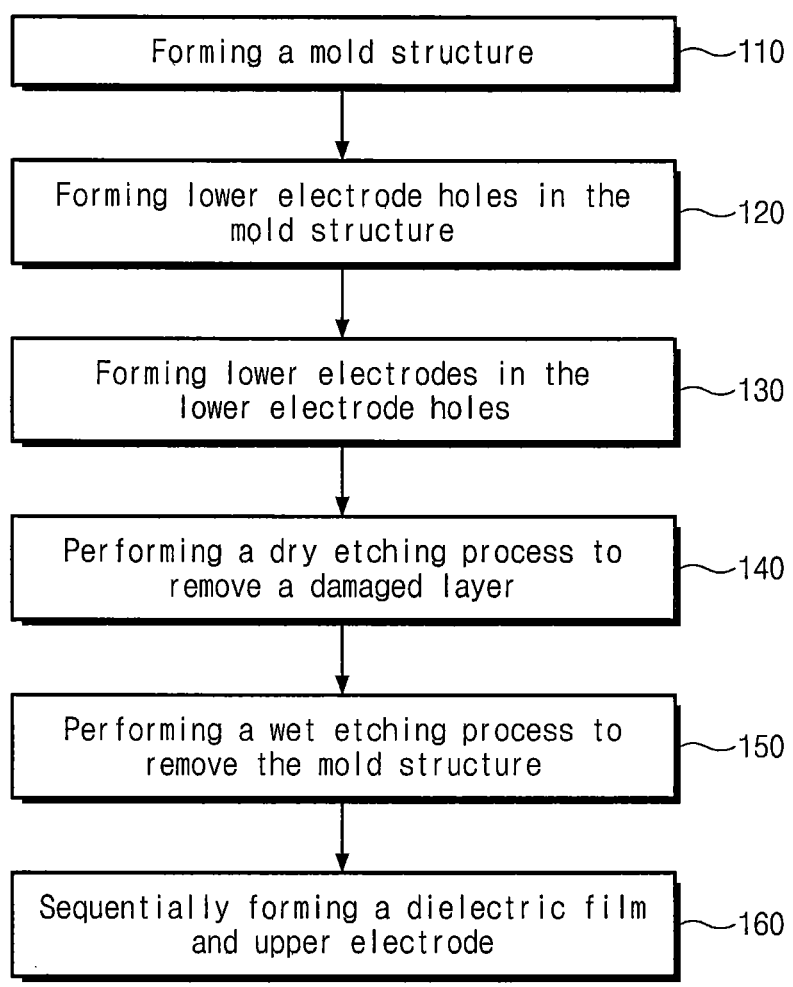

FIG. 22 is a flow chart illustrating a method of fabricating a semiconductor device according to some example embodiments. FIGS. 23 through 29 are sectional views illustrating a method of fabricating a semiconductor device according to some example embodiments.

Figure 23:
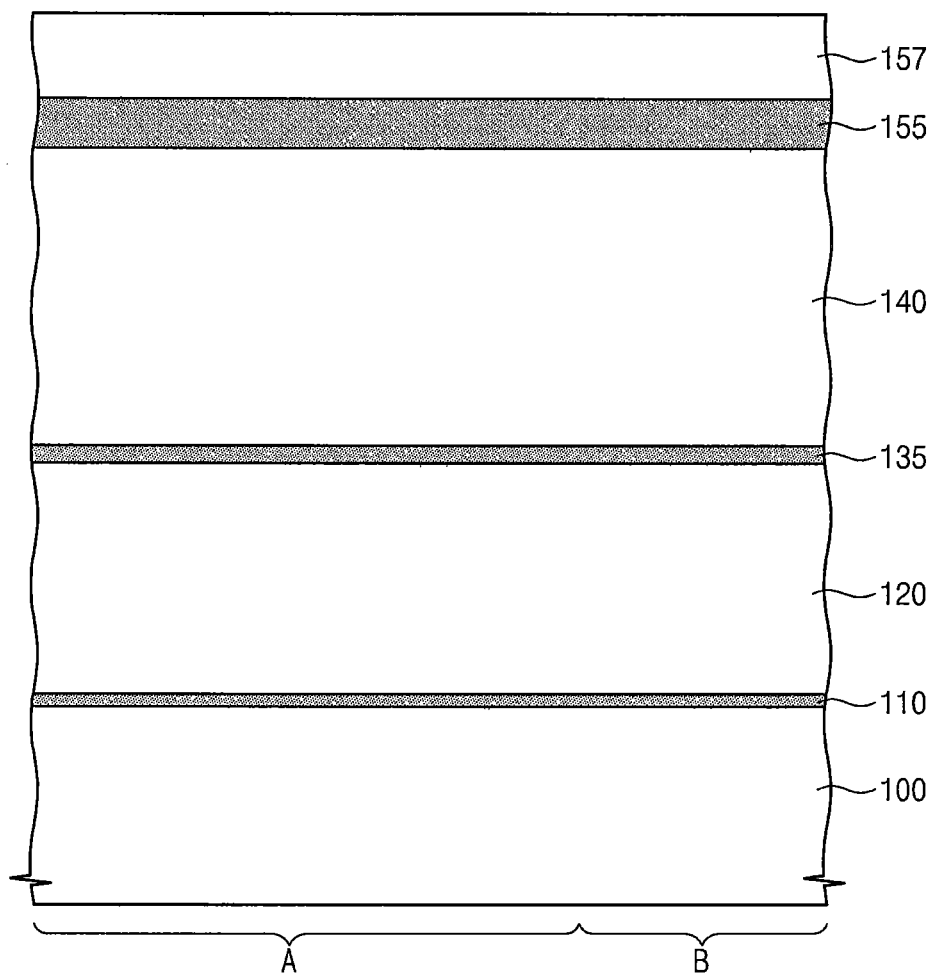

Referring to FIGS. 22 and 23, a mold structure may be formed on a lower structure 100 (Block 110). The lower structure 100 may include a semiconductor substrate including a cell region A and a peripheral circuit region B, memory cells formed on the cell region A of the semiconductor substrate, and peripheral circuits formed on the peripheral circuit region B of the semiconductor substrate, as described with reference to FIG. 11.

According to some embodiments, the formation of the mold structure in FIG. 22 may include sequentially stacking a first mold layer 120, a first supporting layer 135, a second mold layer 140, a second supporting layer 155, and a third mold layer 157 on the lower structure 100. The first mold layer 120, the first supporting layer 135, the second mold layer 140, the second supporting layer 155, and the third mold layer 157 may be formed to cover the lower structure 100 on the cell region A and the peripheral circuit region B.

In some embodiments, the first mold layer 120 and the second mold layer 140 may be formed of a single-crystalline silicon layer, an amorphous silicon layer, a doped silicon layer, a silicon germanium layer, or a carbon-based material. The third mold layer 157 may be formed of the same material as those of the first and second mold layers 120 and 140 or of a material that is different from those of the first and second mold layers 120 and 140 and has an etch selectivity with respect to the second supporting layer 155. For example, the third mold layer 157 may be formed of a silicon oxide layer, such as high density plasma (HDP) oxide, TEOS (TetraEthylOrthoSilicate), PE-TEOS (Plasma Enhanced TetraEthylOrthoSilicate), $O_3$-TEOS ($O_3$-Tetra Ethyl Ortho Silicate), or USG (Undoped Silicate Glass). Furthermore, the first mold layer 120 may be formed to have a thickness that is substantially equivalent to or smaller than that of the second mold layer 140. The third mold layer 157 may be formed to have a smaller thickness than the first and second mold layers 120 and 140.

The first and second supporting layers 135 and 155 may be formed of a material having an etch selectivity with respect to the first to third mold layers 120, 140, and 157. For example, the first and second supporting layers 135 and 155 may be formed of at least one of a silicon nitride layer or a silicon oxynitride layer. Furthermore, the second supporting layer 155 may be formed to be thicker than the first supporting layer 135.

Figure 24:
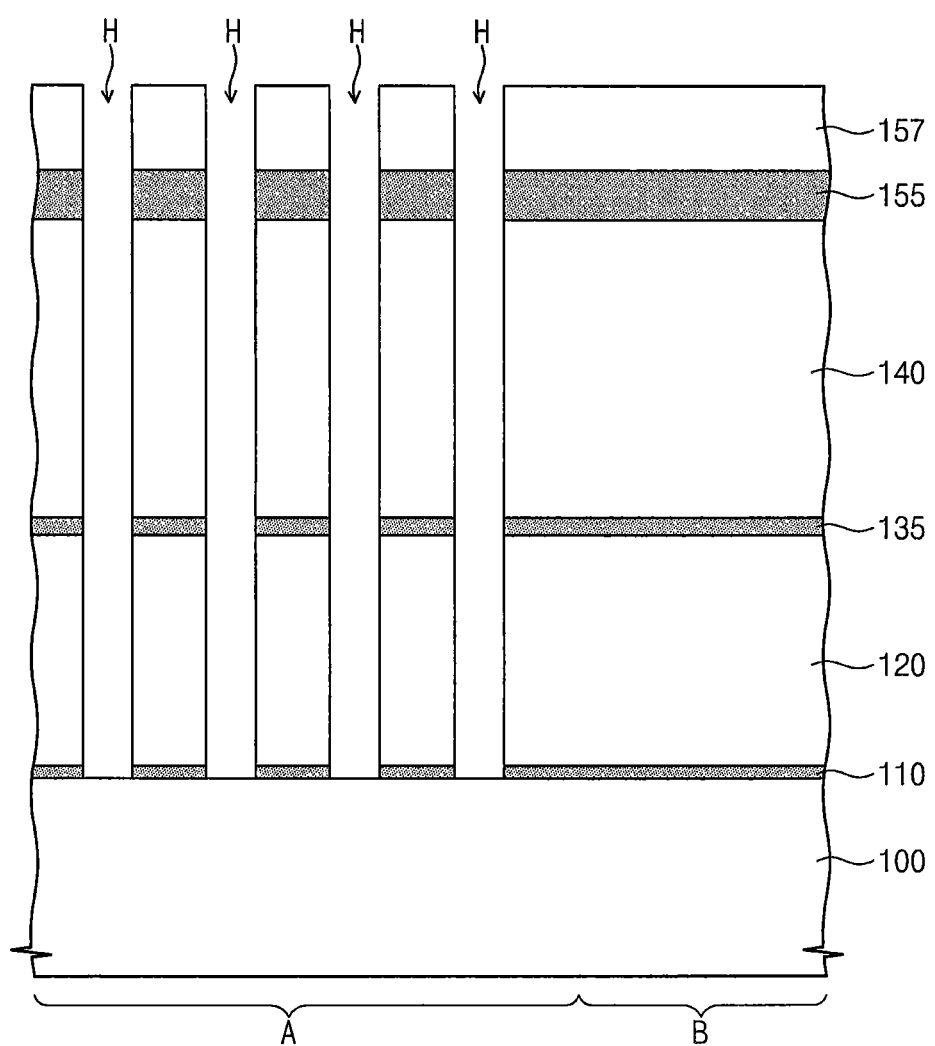

Referring to FIGS. 22 and 24, the mold structure may be patterned to form the lower electrode holes H exposing the lower structure 100 (in Block 120). The formation of the lower electrode holes H may include forming a mask structure on the mold structure and anisotropically etching the mold structure using the mask structure as an etch mask to expose the lower structure 100, as described with reference to FIG. 13. After the formation of the lower electrode holes H, the mask structure may be removed to expose the top surface of the third mold layer 157.

The anisotropic etching for forming the lower electrode holes H may be performed using an etching gas capable of etching the first to third mold layers 120, 140, and 157 and an etching gas capable of etching the first and second supporting layers 135 and 155. The lower electrode holes H may be arranged along column and row directions or arranged in a zigzag manner in plan view, as described herein with reference to FIGS. 1 and 6. Further, a lower electrode hole H may have a smaller width at a lower portion thereof than at an upper portion thereof, as a result of the anisotropic etching process.

Figure 25:
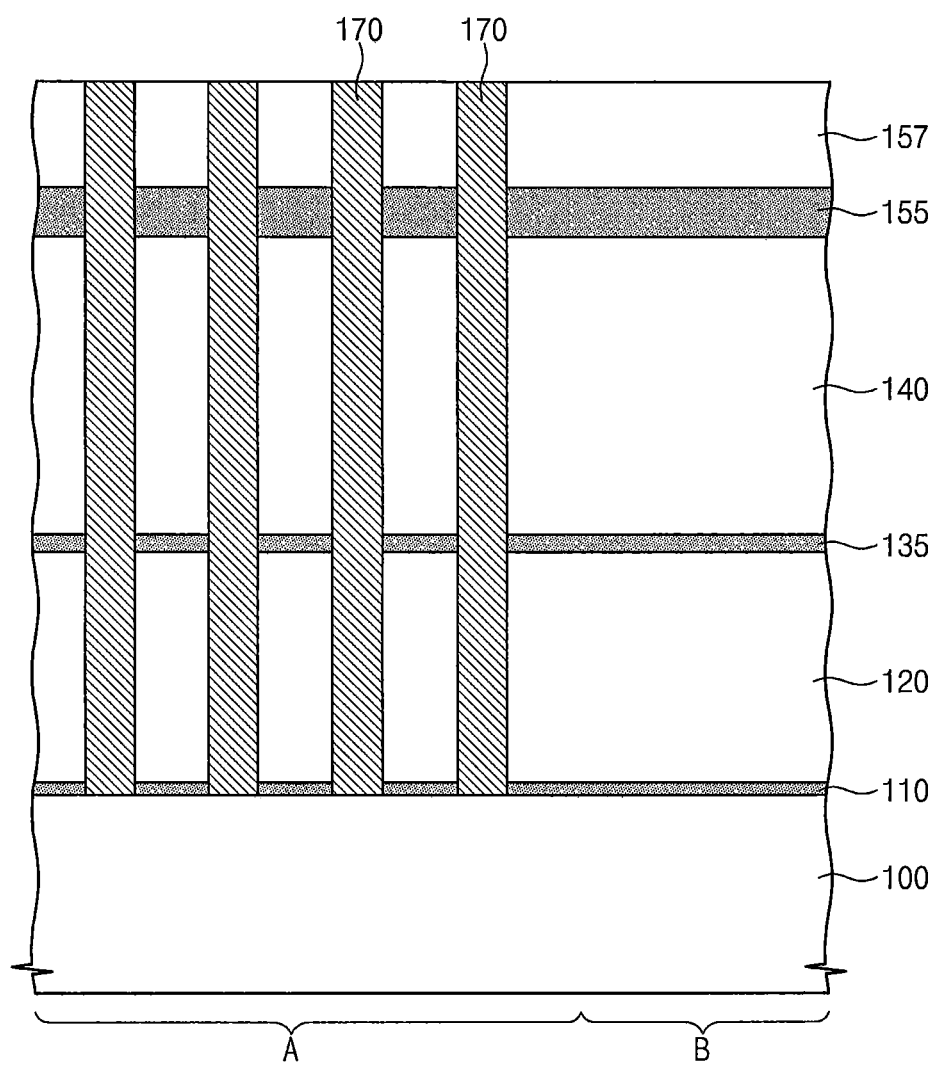

Referring to FIGS. 22 and 25, the lower electrodes 170 may be formed in the lower electrode holes H, respectively (in Block 130). The formation of the lower electrodes 170 may be performed by depositing a conductive layer in the lower electrode holes H and performing a planarization process to remove the conductive layer from a top surface of the third mold layer 157 and to separate the lower electrodes 170 from each other. Accordingly, top surfaces of the lower electrodes 170 may be coplanar with that of the third mold layer 157.

In some example embodiments, the lower electrodes 170 may include at least one of metal materials, metal nitrides, or metal silicides. For example, the lower electrodes 170 may be formed of a refractory metal, such as cobalt, titanium, nickel, tungsten, and molybdenum. In some embodiments, the lower electrodes 170 may be formed of a metal nitride layer, such as a titanium nitride layer (TiN), a titanium silicon nitride layer (TiSiN), a titanium aluminum nitride layer (TiAlN), a tantalum nitride layer (TaN), a tantalum silicon nitride layer (TaSiN), a tantalum aluminum nitride layer (TaAlN), and a tungsten nitride layer (WN). Further, the lower electrodes 170 may be formed of at least one noble metal layer (e.g., selected from the group consisting of platinum (Pt), ruthenium (Ru), and iridium (Ir)). Alternatively, the lower electrodes 170 may be formed of a conductive noble metal oxide (such as PtO, RuO2, or $IrO_2$) or a conductive oxide (such as SRO ($SrRuO_3$), BSRO (($Ba,Sr)RuO_3$), CRO ($CaRuO_3$), or LSCO).

Figure 26:
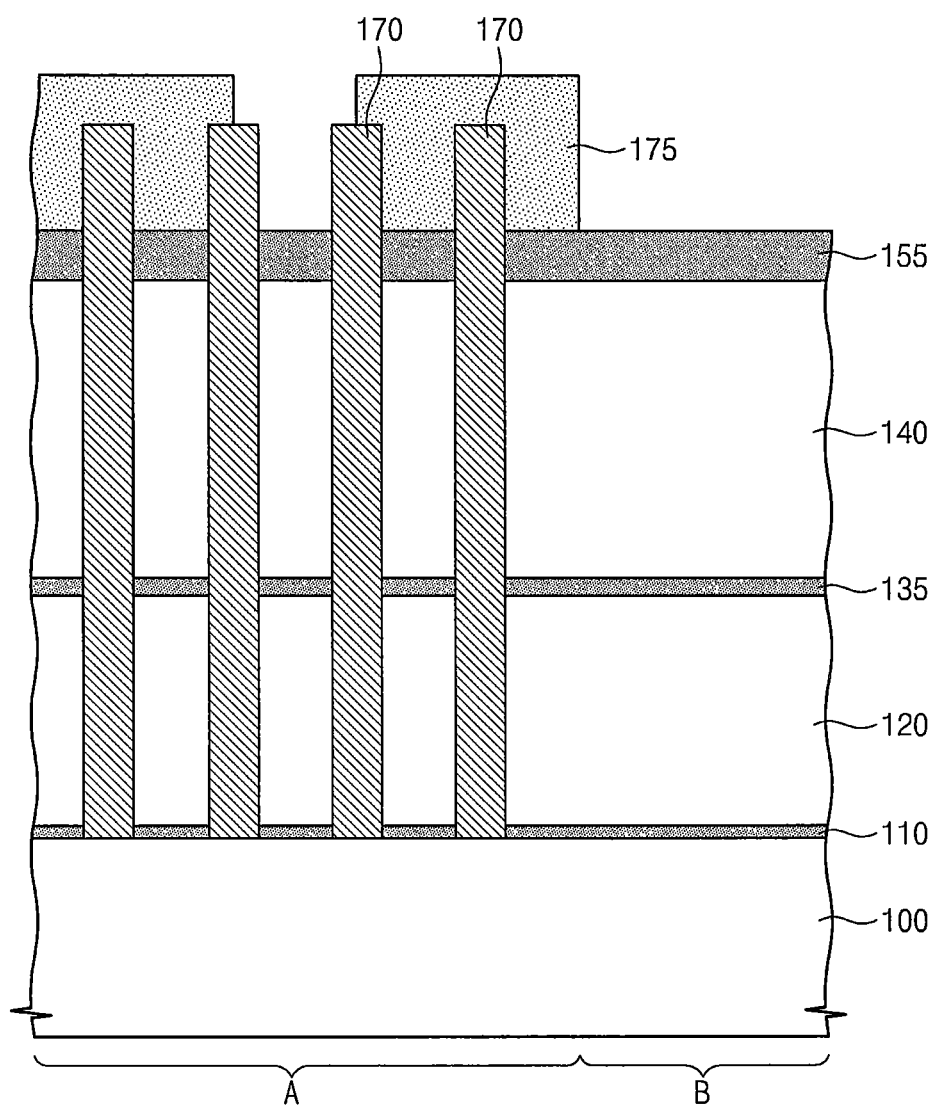

After the formation of the lower electrodes 170, the first and second supporting patterns 132, 152 may be formed and the first to third mold layers 120, 140, and 157 may be removed. Referring to FIG. 26, an isotropic etching process may be performed to remove the third mold layer 157. Because the third mold layer 157 may be formed of a material having an etch selectivity with respect to the lower electrodes 170 and the second supporting layer 155, the top surface of the second supporting layer 155 may be exposed during the removal of the third mold layer 157.

Thereafter, a mask pattern 175 may be formed on the second supporting layer 155 to cover the lower electrodes 170 and expose a portion of the second supporting layer 155.

In some embodiments, the mask pattern 175 may be formed to expose the top surface of the second supporting layer 155 on the peripheral circuit region B and a portion of the second supporting layer 155 on the cell region A. In some embodiments, the third mold layer 157 may not be removed and be used for the mask pattern 175. For example, the mask pattern 175 may be formed by patterning the third mold layer 157.

Figure 27:
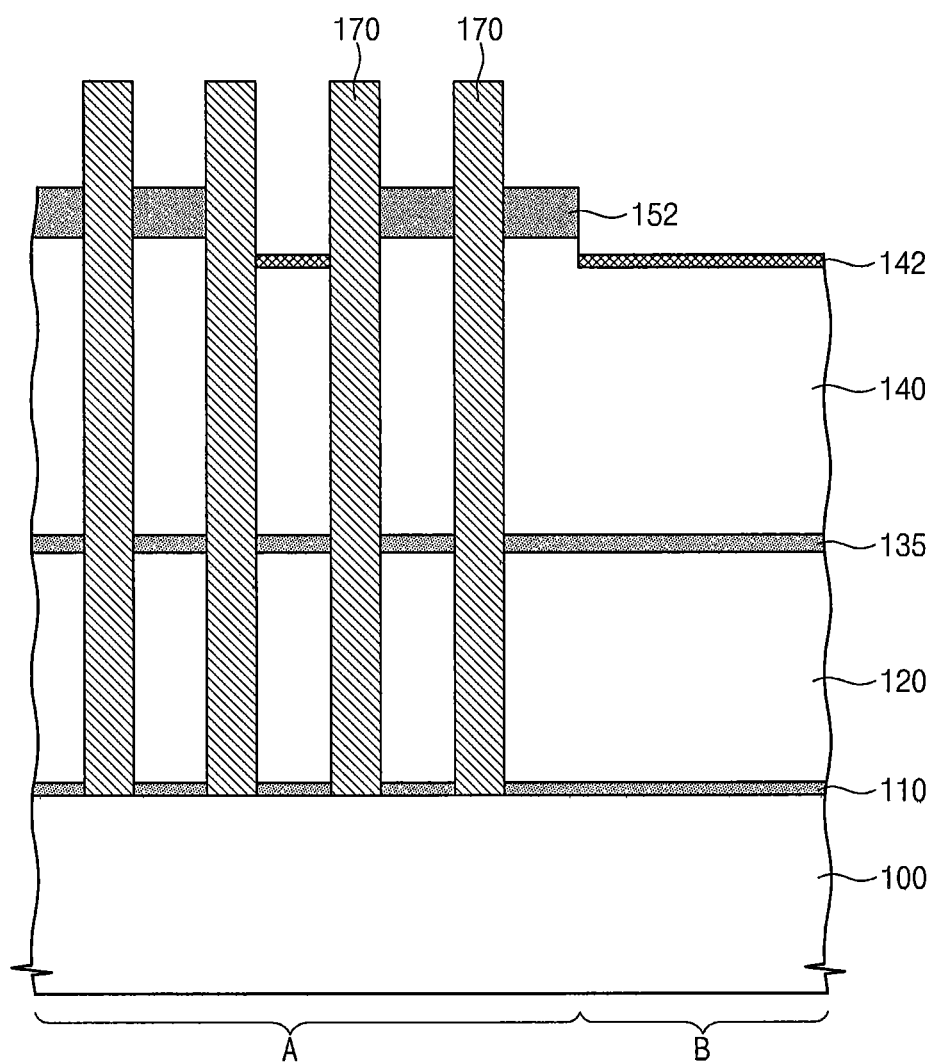

Referring to FIG. 27, the second supporting layer 155 may be anisotropically etched using the mask pattern 175 as an etch mask. Accordingly, as described with reference to FIG. 12, the second supporting pattern 152 may be formed to have openings 151 on the cell region A. For example, the second supporting pattern 152 may be connected to sidewalls of the lower electrodes 170 on the cell region A, and the sidewalls of the lower electrodes 170 may be partially exposed through the openings 151 of the second supporting pattern 152. The second supporting pattern 152 may be formed to expose the second mold layer 140 on the peripheral circuit region B.

Further, in some example embodiments, the anisotropic etching for forming the second supporting pattern 152 may be a high energy plasma etching process. In some embodiments where the second supporting layer 155 is formed of a silicon nitride layer, the plasma etching process may be performed using fluorine-based etching gas. For example, a CxFy-based or CxHyFz-based etching gas may be used to etch anisotropically the second supporting layer 155 that is formed of the silicon nitride layer.

During the high energy plasma etching process, the lower electrodes 170 may be partially exposed by the etching gas to produce a by-product. For example, a nonvolatile polymer (e.g., TiFx) may be produced by a reaction between the fluorine of the fluorine-based etching gas and a metal material of the lower electrodes 170. In addition, high energy ions, which may be used to form the second supporting pattern 152, may be incident into a surface of the second mold layer 140 exposed by the second supporting pattern 152, and thus surface damage may be formed on the surface of the second mold layer 140. For example, in some embodiments where the second mold layer 140 is formed of a silicon-based material, silicon surface defects may be formed by high energy plasma.

For example, the second supporting pattern 152 may be formed by a plasma etching process, and thus an upper damaged layer 142 may be formed on the second mold layer 140 exposed by the second supporting pattern 152. In some example embodiments, during an isotropic etching process for removing the second mold layer 140, the upper damaged layer 142 may have an etch rate slower than that of the second mold layer 140.

Referring to FIG. 22, the upper damaged layer 142 and the second mold layer 140 may be sequentially removed, after the formation of the second supporting pattern 152 (Blocks 140 and 150). In some example embodiments, the upper damaged layer 142 may be removed by an isotropic dry etching process (in Block 140). For example, a remote plasma etching process may be used as the isotropic dry etching process for removing the upper damaged layer 142. In some example embodiments, a fluorine-based etching gas (e.g., CxFy-based or CxHyFz-based gas) may be used in the etching process for removing the upper damaged layer 142.

Referring to FIG. 22, a wet etching process may be performed to remove the second mold layer 140 (in Block 150). The removal of the second mold layer 140 may be performed using an etch recipe having an etch selectivity with respect to the lower electrodes 170, the second supporting pattern 152, and the first supporting layer 135. For example, in some embodiments where the second mold layer 140 is formed of a silicon-based material, the removal of the second mold layer 140 may be performed using an etching solution (such as potassium hydroxide (KOH), ammonium hydroxide (NH$_4$OH), sodium hydroxide (NaOH), or tetramethyl ammonium hydroxide (TMAH)).

Figure 28:
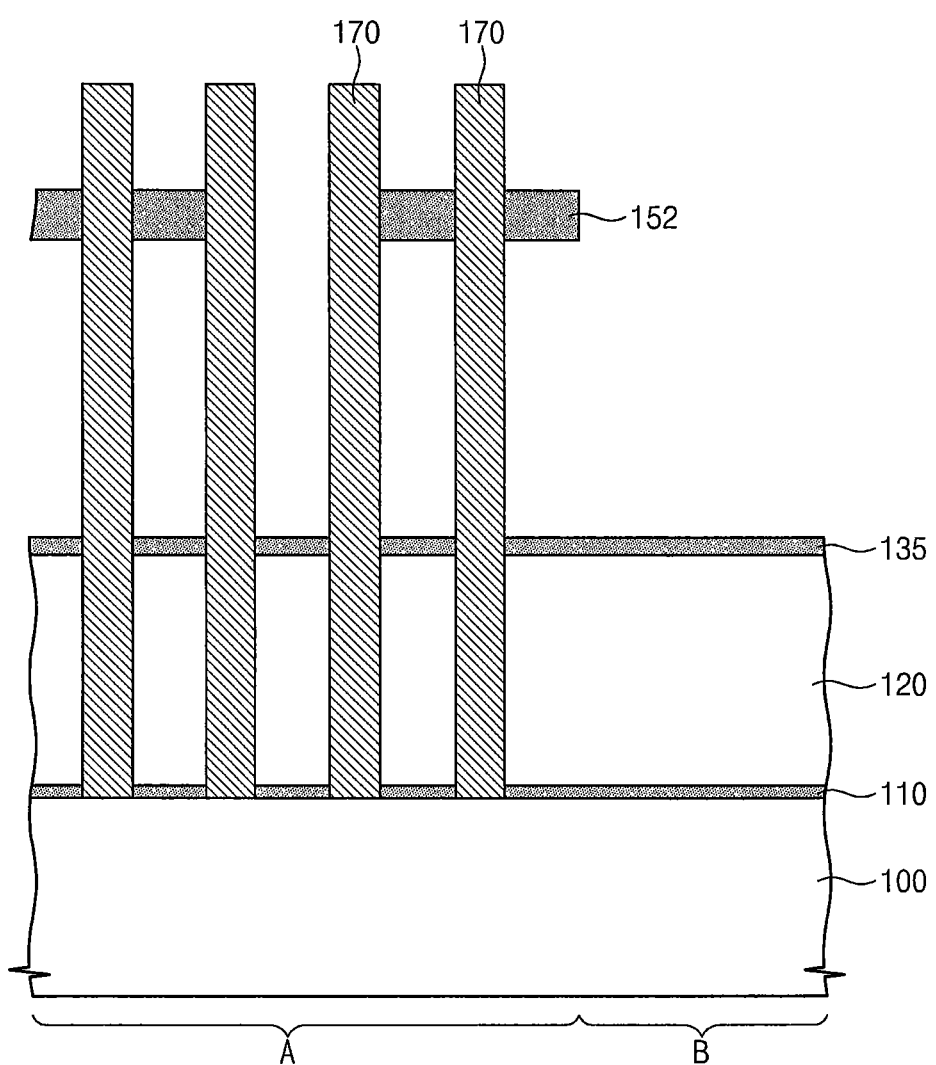

Moreover, because the upper damaged layer 142 and the second mold layer 140 may be sequentially removed, upper sidewalls of the lower electrodes 170 may be exposed, as shown in FIG. 28. Further, the top surface of the first supporting layer 135 may be exposed as the result of the removal of the second mold layer 140.

Figure 29:
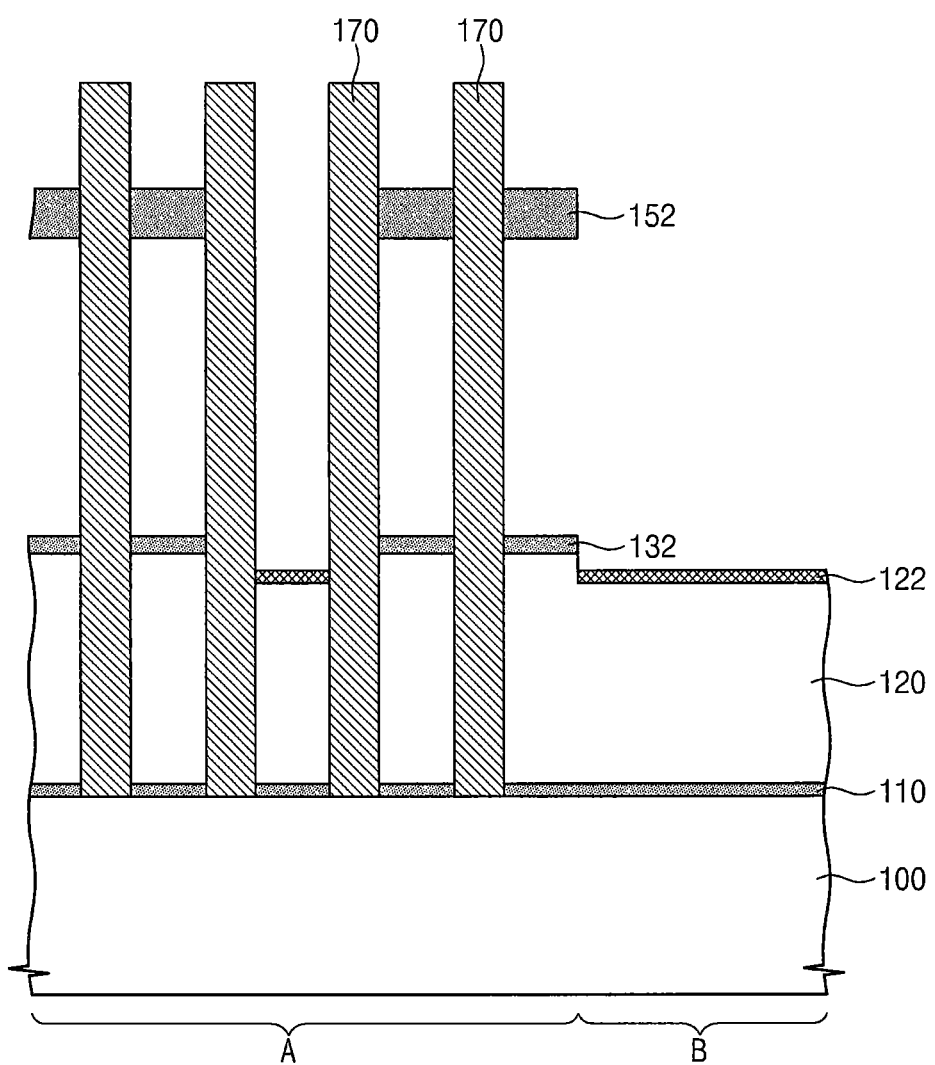

Referring to FIG. 29, the first supporting layer 135 may be patterned to form the first supporting pattern 132. In some example embodiments, the first supporting pattern 132 may be formed by anisotropically etching the first supporting layer 135 using the second supporting pattern 152 as an etch mask. Because the second supporting pattern 152 may be used as the etch mask, a thickness of the second supporting pattern 152 may be reduced during the formation of the first supporting pattern 132. In addition, as described with reference to FIG. 27, the anisotropic etching of the first supporting layer 135 may be performed using a high energy plasma etching process, and thus a lower damaged layer 122 may be formed on a surface of the first mold layer 120 exposed by the first supporting pattern 132. Accordingly, the lower damaged layer 122 and the first mold layer 120 may be sequentially removed after the formation of the first supporting pattern 132. For example, the lower damaged layer 122 may be removed by an isotropic dry etching process, in which a remote plasma is used, as described herein. In some embodiments, the first mold layer 120 may be removed by an isotropic wet etching process that is configured to have an etch selectivity with respect to first and second supporting patterns 132 and 152. As a result of the removal of the first mold layer 120, the lower sidewalls of the lower electrodes 170 may be exposed. Thereafter, the dielectric film 180 (shown in FIG. 2) and the upper electrode 190 (shown in FIG. 2) may be sequentially formed on the lower electrodes 170 (in Block 160 of FIG. 22).

Figure 30:
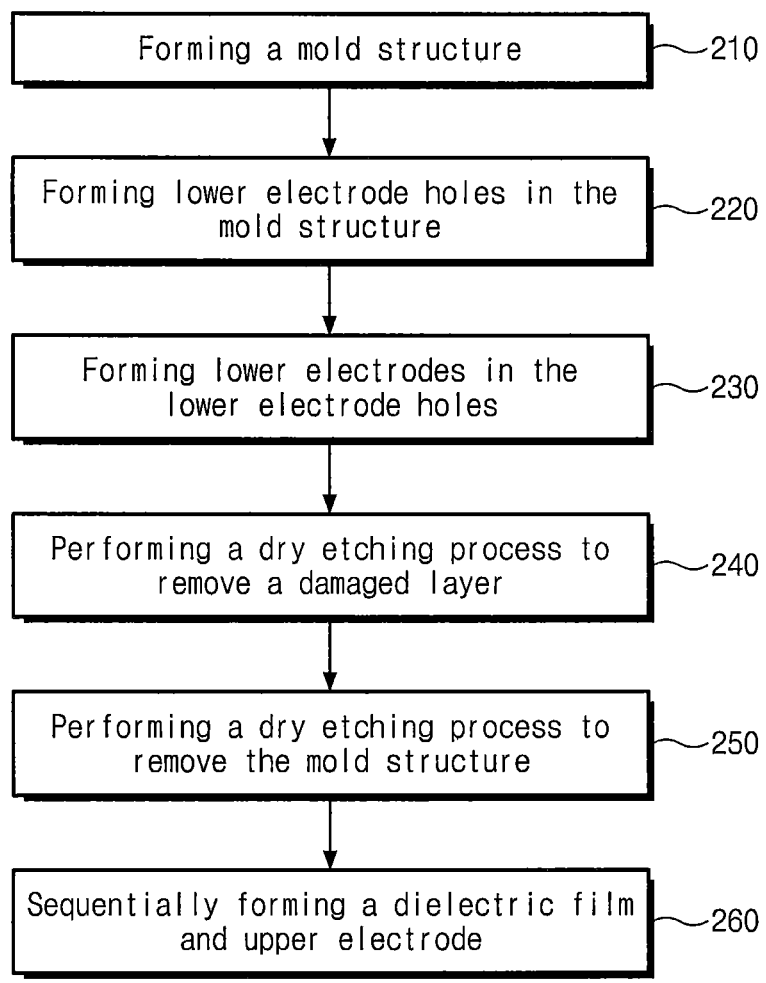

FIG. 30 is a flow chart illustrating a method of fabricating a semiconductor device according to some example embodiments. Referring to FIG. 30, after the formation of the lower electrodes 170, an isotropic dry etching process may be performed to remove the upper damaged layer 142 and the second mold layer 140 sequentially. For example, as shown in FIGS. 23 and 30, the mold structure may be formed on the lower structure 100 (in Block 210). The mold structure may include the first mold layer 120, the first supporting layer 135, the second mold layer 140, the second supporting layer 155, and the third mold layer 157 that are sequentially stacked on the lower structure 100.

Referring to FIGS. 24 and 30, the mold structure may be patterned to form the lower electrode holes H (in Block 220). Thereafter, as shown in FIGS. 25 and 30, the lower electrodes 170 may be formed in the lower electrode holes H, respectively (in Block 230).

As described with reference to FIGS. 26 and 27, the second supporting layer 155 may be patterned to form the second supporting pattern 152. Moreover, because a portion of the second mold layer 140 may be exposed to high energy plasma during the formation of the second supporting pattern 152, the upper damaged layer 142 may be formed on a surface of the second mold layer 140 exposed by the second supporting pattern 152. Accordingly, as shown in FIG. 30, the upper damaged layer 142 and the second mold layer 140 may be sequentially removed after the formation of the lower electrodes 170 and the second supporting pattern 152 (Blocks 240 and 250).

Referring to FIGS. 27, 28, and 30, the upper damaged layer 142 may be removed by an isotropic dry etching process (in Block 240). For example, the isotropic dry etching process may be a remote plasma etching process. Further, the removal of the upper damaged layer 142 may be performed using a fluorine-based etching gas (e.g., a CxFy-based or CxHyFz-based gas).

Next, an isotropic dry etching process may be performed to remove the second mold layer 140. In other words, both of the upper damaged layer 142 and the second mold layer 140 may be removed using the remote plasma etching process.

As described with reference to FIG. 29, the first supporting pattern 132 may be formed on the first mold layer 120, and the lower damaged layer 122 and the first mold layer 120 may thereafter be sequentially removed by an isotropic dry etching process. Next, the dielectric film 180 and the upper electrode 190 may be sequentially formed on the lower electrodes 170 (in Block 260 of FIG. 30).

Figure 31:
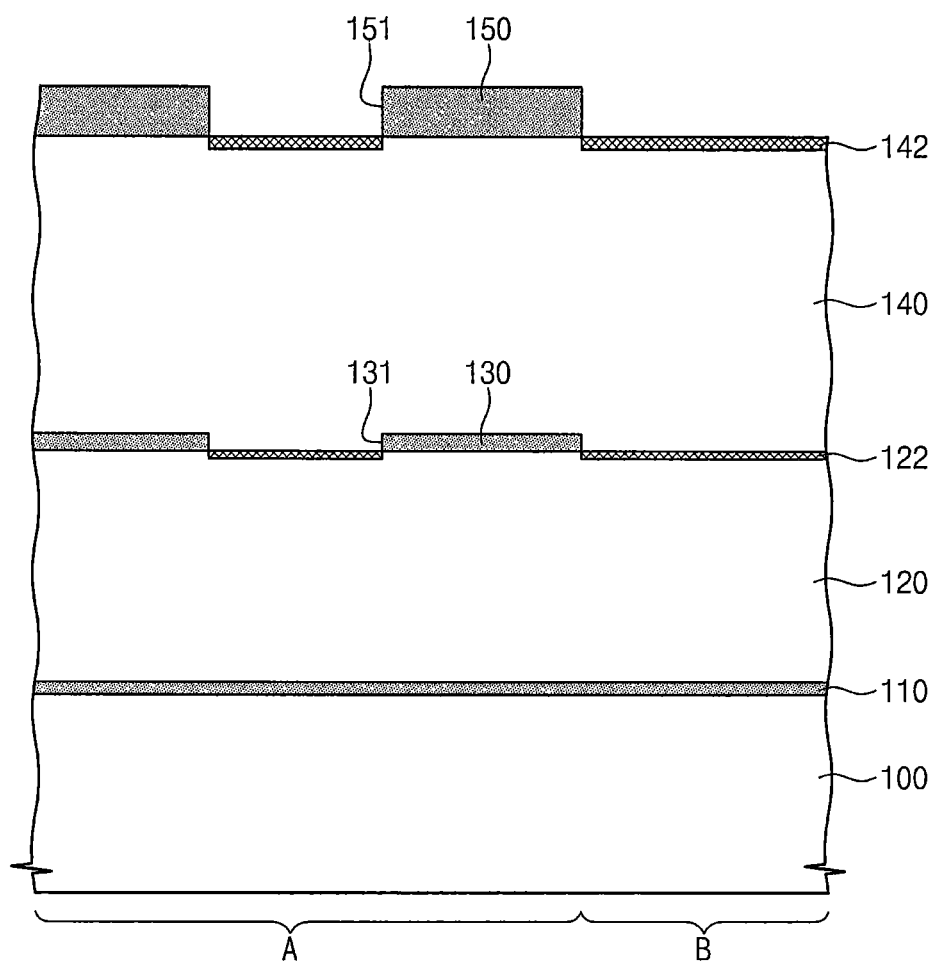

FIGS. 31 through 36 are sectional views illustrating a method of fabricating a semiconductor device according to some example embodiments. Referring to FIG. 31, as described with reference to FIGS. 11 through 13, a mold structure may be formed on the lower structure 100 including the cell region A and the peripheral circuit region B. For example, the mold structure may include the first and second mold layers 120 and 140 and the first and second supporting layers 130 and 150.

The first supporting layer 130 may be patterned to have the first openings 131 on the cell region A, as described with reference to FIG. 11. In some example embodiments, a high energy plasma etching process may be performed to pattern the first supporting layer 130, and thus surface defects may occur on a surface of the first mold layer 120 exposed by the first opening 131. For example, the lower damaged layer 122 may be formed on the surface of the first mold layer 120 exposed by the first opening 131.

The second mold layer 140 may be provided on the first supporting layer 130 to cover a top surface of the lower damaged layer 122. The second supporting layer 150 may be patterned to have the second openings 151, as described with reference to FIG. 12. As described herein, when the first supporting layer 150 is formed on the second mold layer 140, the upper damaged layer 142 may be formed on portions of the second mold layer 140 exposed by the second openings 151.

Figure 32:
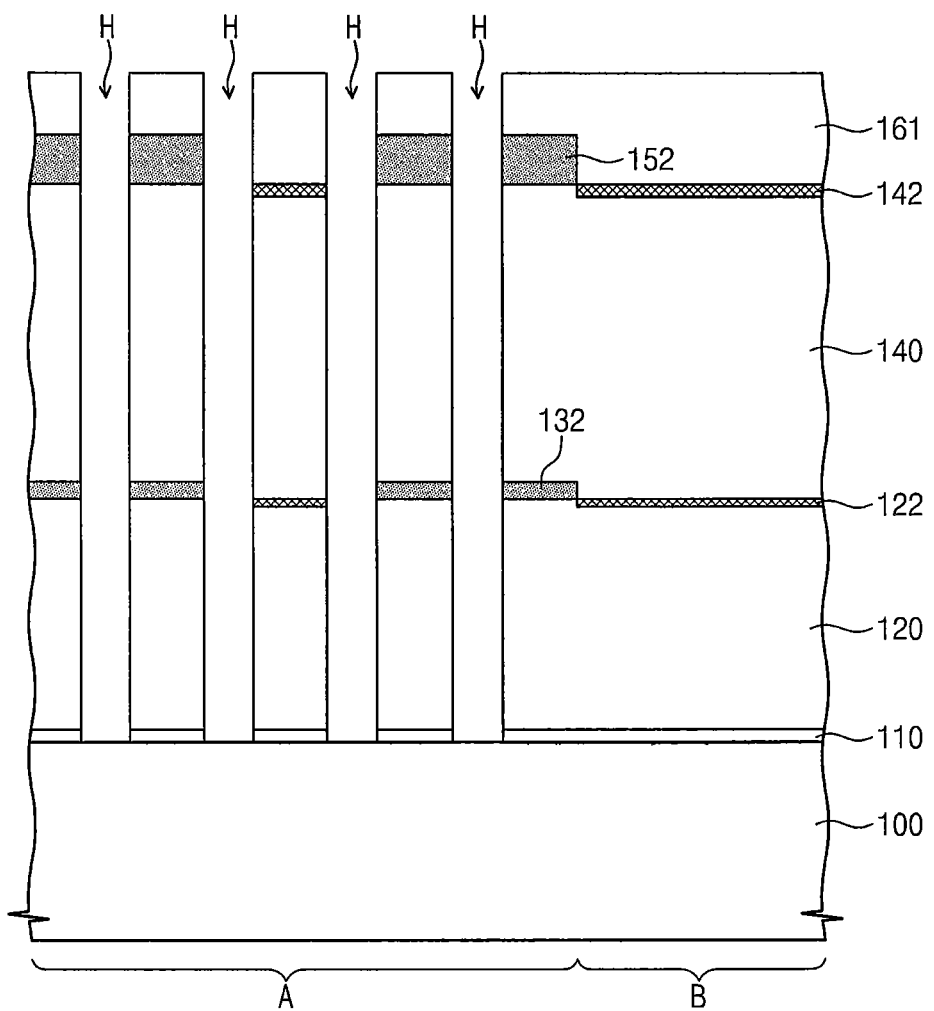

Referring to FIG. 32, the mold structure may be patterned to form the lower electrode holes H exposing the lower structure 100. The formation of the lower electrode holes H may include forming a mask structure on the mold structure and anisotropically etching the mold structure using the mask structure as an etch mask to expose the lower structure 100, as described with reference to FIG. 13. In some example embodiments, before the formation of the lower electrode holes H, the sacrificial mask layer 161 may be formed to fill the second openings 151 of the second supporting layer 150.

Figure 33:
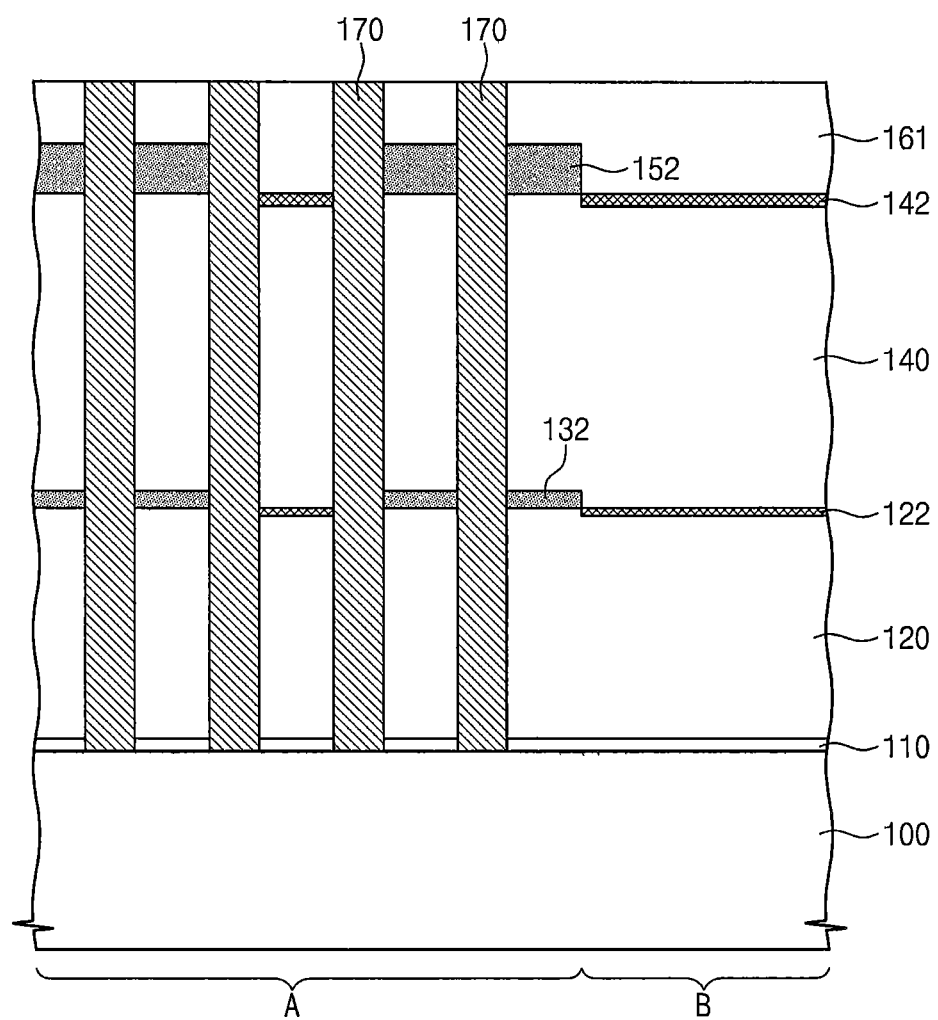

As a result of the formation of the lower electrode holes H, the second supporting pattern 152 may be formed to have the second openings 151 and the lower electrode holes H penetrating the same, and the first supporting pattern 132 may be formed to have the first openings 131 and the lower electrode holes H penetrating the same. Referring to FIG. 33, the lower electrodes 170 may be formed in the lower electrode holes H, respectively, as described with reference to FIG. 25. The formation of the lower electrodes 170 may include depositing a conductive layer in the lower electrode holes H, and then performing a planarization process to remove the conductive layer from a top surface of the sacrificial mask layer 161. As a result of the planarization, the lower electrodes 170 may be separated from each other. Accordingly, the lower electrodes 170 may have top surfaces that are coplanar with that of the sacrificial mask layer 161, as illustrated in FIG. 33.

Figure 34:
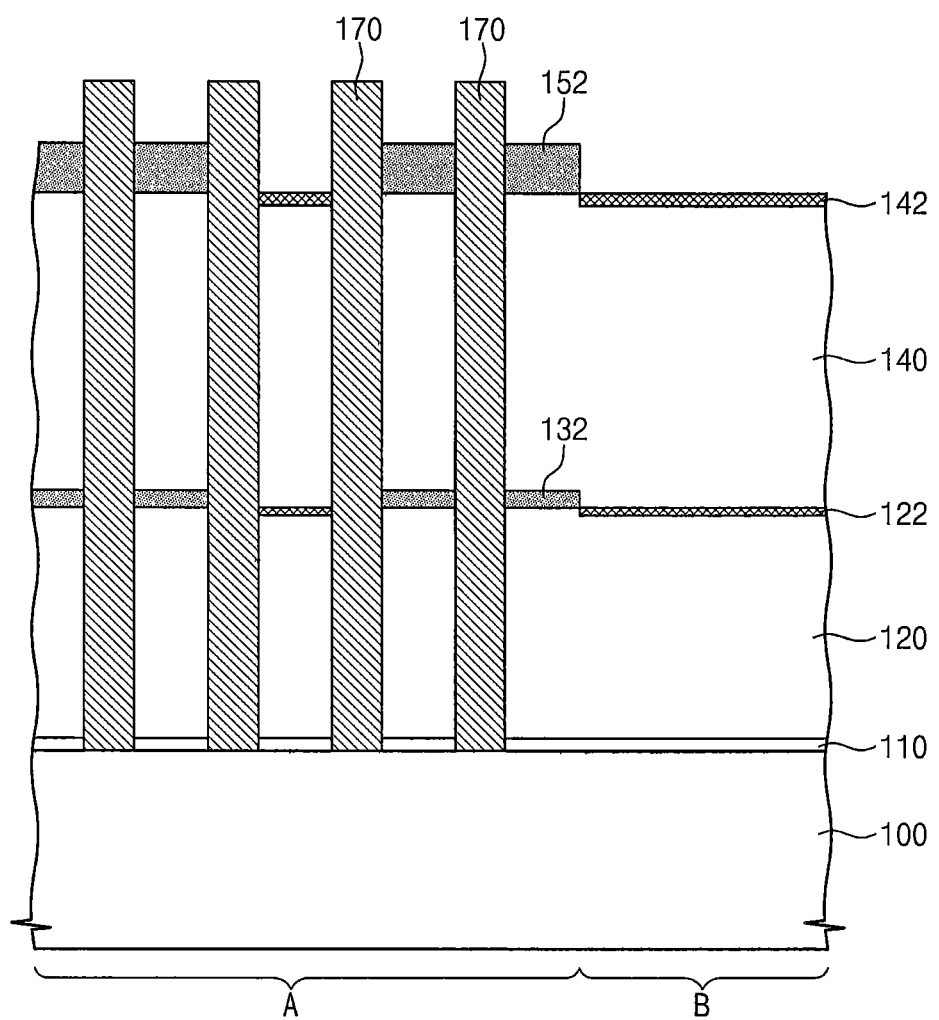

After the formation of the lower electrodes 170, the sacrificial mask layer 161 may be removed to expose the second supporting pattern 152. The removal of the sacrificial mask layer 161 may be performed using an isotropic wet etching process. For example, the removal of the sacrificial mask layer 161 may be performed in such a way that the second supporting pattern 152 and the upper damaged layer 142 have etch rates slower than that of the sacrificial mask layer 161. The second supporting pattern 152 and the upper damaged layer 142 may be exposed after the removal of the sacrificial mask layer 161, as shown in FIG. 34.

Figure 35:
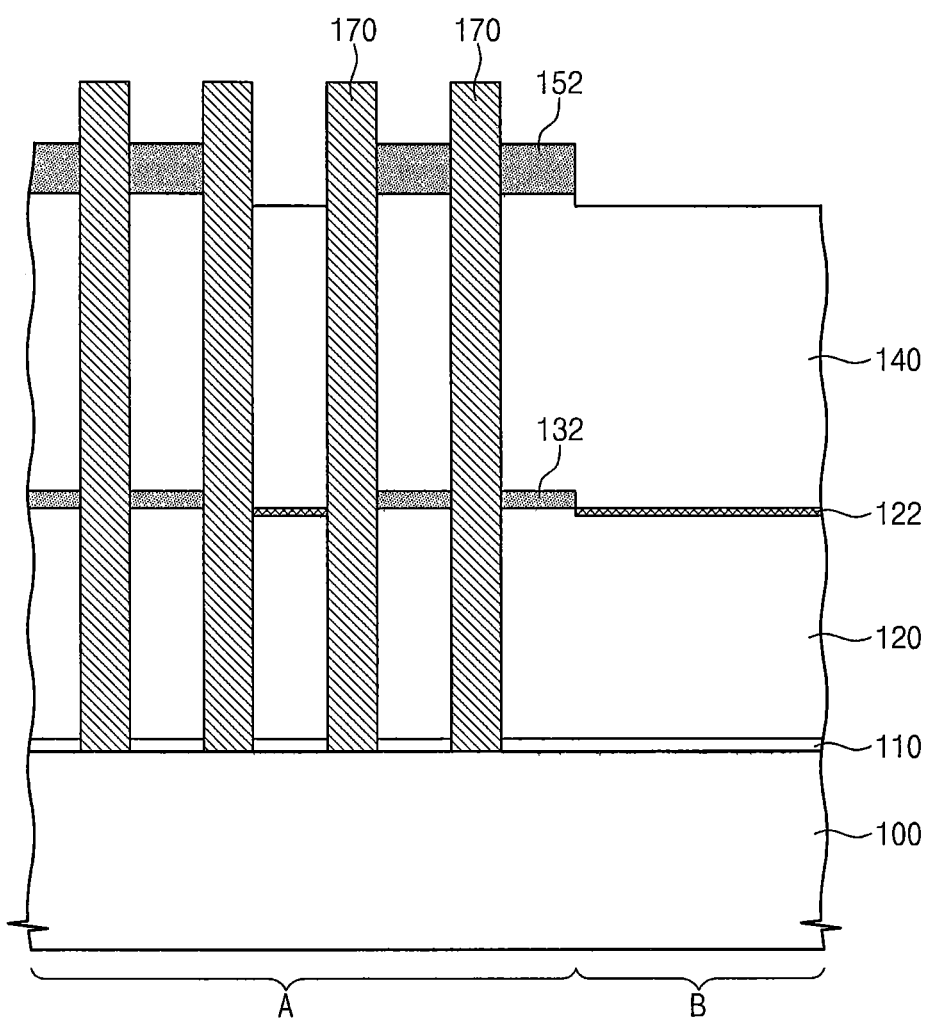

Referring to FIG. 35, an isotropic dry etching process may be performed to remove the upper damaged layer 142. The upper damaged layer 142 may be removed using a remote plasma etching process, as described with reference to FIG. 22. Further, the removal of the upper damaged layer 142 may be performed using a fluorine-based etching gas (e.g., a CxFy-based or CxHyFz-based gas).

Figure 36:
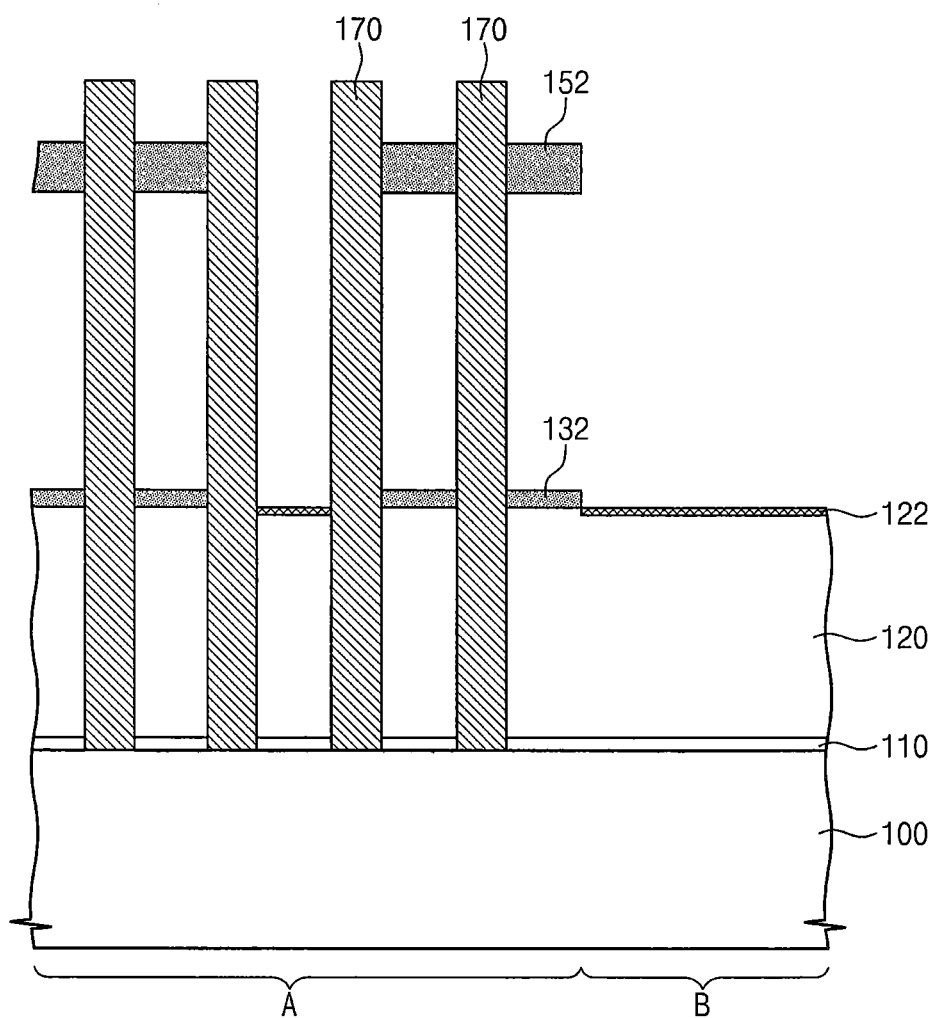

Thereafter, a wet etching process may be performed to remove the second mold layer 140. The second mold layer 140 may be removed using etching solution having an etch selectivity with respect to the second supporting pattern 152 and the first supporting pattern 132, as described with reference to FIG. 22. For example, in some embodiments where the second mold layer 140 is formed of a silicon-based material, at least one of potassium hydroxide (KOH), ammonium hydroxide (NH$_4$OH), sodium hydroxide (NaOH), or TMAH (tetramethyl ammonium hydroxide) may be the etching solution for removing the second mold layer 140. In some embodiments, as shown in FIG. 36, the first supporting pattern 132 and the lower damaged layer 122 may be exposed as a result of the removal of the second mold layer 140.

The removal of the second mold layer 140 may be performed using an isotropic dry etching process, similar to the process for removing the upper damaged layer 142. For example, the second mold layer 140 may be removed by a remote plasma etching process in which a fluorine-based etching gas is used.

Thereafter, the lower damaged layer 122 and the first mold layer 120 may be sequentially removed. The removal of the lower damaged layer 122 and the first mold layer 120 may include an isotropic dry etching process and an isotropic wet etching process that are sequentially performed, similar to the process of removing the upper damaged layer 142 and the second mold layer 140. Alternatively, the lower damaged layer 122 and the first mold layer 120 may be sequentially removed by at least one isotropic dry etching process.

Figure 37:
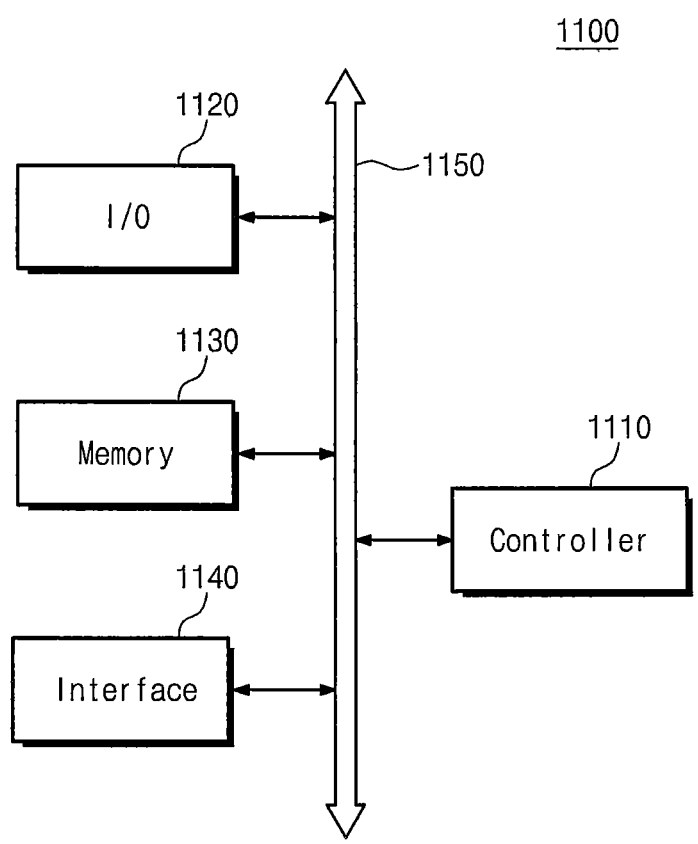

FIG. 37 is a schematic block diagram illustrating a memory system including a semiconductor device according to some example embodiments. Referring to FIG. 37, an electronic system 1100 may include a controller 1110, an input/output (I/O) unit 1120, a memory device 1130, an interface 1140, and a bus 1150. The controller 1110, the input/output unit 1120, the memory device 1130, and/or the interface 1140 may be connected or coupled to each other via the bus 1150 serving as a pathway for data communication. At least one of the controller 1110, the input/output unit 1120, the memory device 1130, and/or the interface 1140 may include a semiconductor device according to example embodiments described herein.

The controller 1110 may include, e.g., at least one of a microprocessor, a digital signal processor, a microcontroller, or another logic device. The other logic device may have a similar function to any one of the microprocessor, the digital signal processor, and the microcontroller. The input/output unit 1120 may include a keypad, keyboard, a display device, and so forth. The memory device 1130 may be configured to store data and/or commands. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. The electronic system 1100 may further include a fast Dynamic Random Access Memory (DRAM) device and/or a fast Static Random Access Memory (SRAM) device that acts as a cache memory for improving an operation of the controller 1110.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data wirelessly.

Figure 38:
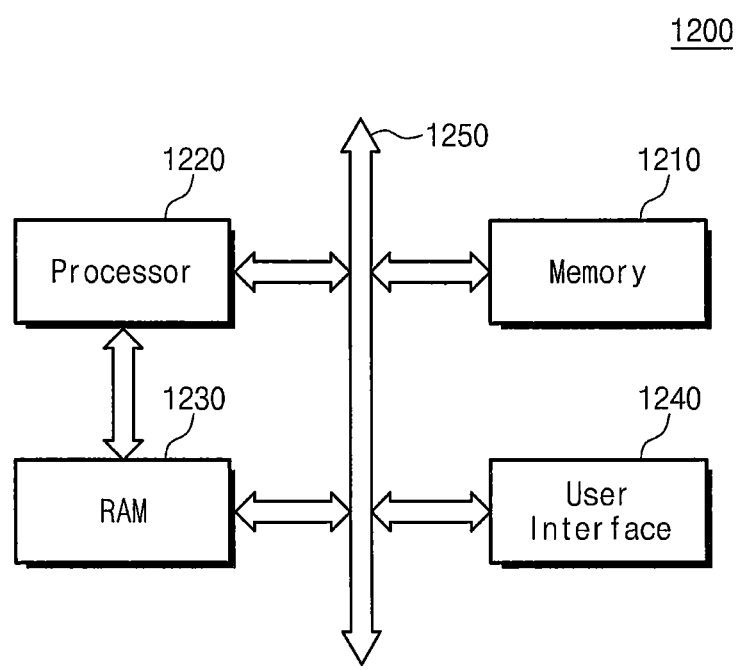

FIG. 38 is a schematic block diagram illustrating an example of an electronic system including a semiconductor memory device according to some embodiments. Referring to FIG. 38, an electronic system 1200 may include at least one of the semiconductor memory devices according to example embodiments described herein. The electronic system 1200 may include a mobile device or a computer. As an example, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, all or each of the processor 1220 and the RAM 1230 may include a semiconductor device according to example embodiments described herein. Alternatively, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220, or data input from the outside (e.g., externally). The memory system 1210 may include a controller and a memory device or may be provided in the form of the electronic system 1110 of FIG. 37.

The electronic system 1200 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1200 performs wireless communications, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

According to some example embodiments described herein, a first supporting pattern supporting lower portions of lower electrodes may be formed before forming a second supporting pattern supporting upper portions of the lower electrodes, and it may thus be possible to adjust a vertical space between the first supporting pattern and the second supporting pattern to a desired space.

Furthermore, because the first and second supporting patterns may be formed before the formation of the lower electrodes, it may be possible to protect/prevent the lower electrodes from being damaged or to protect/prevent side products (e.g., nonvolatile polymer) from being produced during the formation of the first and second supporting patterns. In addition, a buffer layer may be formed on a surface of a silicon-based mold layer, and it may thus be possible to protect/prevent the mold layer from being damaged in an anisotropic etching process for forming the first and second supporting patterns. In other words, because it may be possible to protect/prevent side products from being produced or to protect/prevent the mold layer from being damaged during the formation of the first and second supporting patterns, the mold layer used for forming the lower electrodes can be easily removed.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a plurality of capacitors comprising:
  a plurality of respective lower electrodes on the substrate;
  a dielectric film on surfaces of the plurality of lower electrodes; and
  an upper electrode on the dielectric film;
a first supporting pattern connected to lower sidewalls of the plurality of lower electrodes and comprising a first opening; and
a second supporting pattern connected to upper sidewalls of the plurality of lower electrodes and comprising a second opening,
wherein the second opening overlaps at least a portion of the first opening in plan view,
wherein the first opening comprises a first width that is wider than a second width of the second opening,
wherein a first vertical distance between the first and second supporting patterns is longer than a second vertical distance between the first supporting pattern and respective bottom portions of the plurality of lower electrodes adjacent the substrate, and
wherein a ratio of the second vertical distance to the first vertical distance ranges from more than 1:1 to about 1:9.

2. The device of claim 1, wherein the first supporting pattern comprises a first thickness that is substantially equivalent to or thinner than a second thickness of the second supporting pattern.

3. The device of claim 1, wherein respective top surfaces of the plurality of lower electrodes are substantially coplanar.

4. The device of claim 1, wherein the second supporting pattern at least partially overlaps the first supporting pattern.

5. The device of claim 1, wherein a portion of the upper electrode is between the first supporting pattern and the substrate.

6. The device of claim 1, wherein the plurality of lower electrodes protrude beyond the second supporting pattern in a direction away from the substrate.

7. The device of claim 1, wherein the second supporting pattern bridges a gap between adjacent first and second ones of the plurality of lower electrodes.

8. The device of claim 7, wherein the first and second widths are wider than the gap between the adjacent first and second ones of the plurality of lower electrodes.

9. The device of claim 1, wherein the first and second openings of the first and second supporting patterns, respectively, are wider than a gap between adjacent first and second ones of the plurality of lower electrodes.

10. The device of claim 1, wherein each of the plurality of lower electrodes comprises a uniform width.

\* \* \* \* \*